(12) United States Patent
Ayon

(10) Patent No.: US 6,399,516 B1
(45) Date of Patent: Jun. 4, 2002

(54) PLASMA ETCH TECHNIQUES FOR FABRICATING SILICON STRUCTURES FROM A SUBSTRATE

(75) Inventor: Arturo A. Ayon, Norton, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 09/430,565

(22) Filed: Oct. 29, 1999

Related U.S. Application Data

(60) Provisional application No. 60/106,251, filed on Oct. 30, 1998.

(51) Int. Cl.$^7$ .......................................... H01L 21/3065
(52) U.S. Cl. .......................................... 438/739; 438/52
(58) Field of Search ................ 216/2, 37; 280/735; 310/40 MM; 438/52, 739

(56) References Cited

U.S. PATENT DOCUMENTS

| | | | |
|---|---|---|---|
| 4,956,844 A | 11/1990 | Goodhue et al. | 372/44 |
| 5,198,390 A | 3/1993 | MacDonald et al. | 438/52 |
| 5,262,000 A | * 11/1993 | Welbourn et al. | 216/2 |
| 5,316,979 A | 5/1994 | MacDonald et al. | 438/52 |
| 5,393,375 A | * 2/1995 | MacDonald et al. | 216/2 |

(List continued on next page.)

FOREIGN PATENT DOCUMENTS

| | | | |
|---|---|---|---|
| JP | 2000-210900 | * 8/2000 | B81C/1/00 |

OTHER PUBLICATIONS

Borghesani et al., "Unfercut in a $CF_4$–Based High–Pressure Poly–Si Plasma Etch," *Japanese Jnl. of Applied Physics*, vol. 22, No. 4, pp. 712–718, Apr. 1983.

Dalton, et al., "Microtrench Formation in Polysilicon Plasma Etching over Thin Gate Oxide," *J. Electrochem. Soc.*, vol. 140, No. 8, pp. 2395–2401, Aug. 1993.

(List continued on next page.)

*Primary Examiner*—Gregory Mills
*Assistant Examiner*—Rudy Zervigon
(74) *Attorney, Agent, or Firm*—Theresa A. Lober

(57) ABSTRACT

Provided is a method for producing a silicon element. A substrate configuration is provided that includes a silicon layer having a first face and a thickness corresponding to a specified thickness of the silicon element to be formed. The configuration includes a layer of an electrically-insulating material located below and adjacent to the silicon layer. A substantially vertical trench is etched from the first face in the silicon layer to a depth that exposes the insulating layer. Then the trench in the silicon layer is exposed to a gaseous environment that is reactive with silicon, to substantially lateral etch the silicon layer preferentially at the depth of the insulating layer along a surface of the insulating layer. This lateral etch is continued for a duration that results in release of a silicon element over the insulating layer. Also provided is a process for etching an angled trench in a silicon layer. Here, a substrate configuration is provided including a first silicon layer having at least one trench etched through the first silicon layer, and layer of an electrically-insulating material located below and adjacent to the silicon layer. The insulating layer includes an aperture that is located at a non-central location with respect to the trench and that corresponds to a prespecified trench angle. Included is a second silicon layer, in which the angled trench is to be formed, below and adjacent to the insulating layer. The trench in the first silicon layer is exposed to a gaseous environment that is reactive with silicon to etch that region of the second silicon layer that is exposed by the aperture in the insulating layer to a selected angled trench depth and prespecified trench angle.

30 Claims, 16 Drawing Sheets

U.S. PATENT DOCUMENTS

| | | | |
|---|---|---|---|
| 5,427,975 A | 6/1995 | Sparks et al. | 438/52 |
| 5,501,893 A | 3/1996 | Laemer et al. | 428/161 |
| 5,531,121 A | 7/1996 | Sparks et al. | 73/716 |
| 5,540,812 A | 7/1996 | Kadomura | 438/710 |
| 5,573,679 A | 11/1996 | Mitchell et al. | 216/2 |
| 5,587,343 A * | 12/1996 | Kano et al. | 438/52 |
| 5,595,940 A | 1/1997 | Trah et al. | 438/50 |
| 5,620,931 A | 4/1997 | Tsang et al. | 438/50 |
| 5,628,917 A | 5/1997 | MacDaonald et al. | 216/2 |
| 5,629,918 A * | 5/1997 | Ho et al. | 310/40 MM |
| 5,658,472 A | 8/1997 | Bartha et al. | 216/2 |
| 5,719,073 A | 2/1998 | Shaw et al. | 438/53 |
| 5,808,781 A | 9/1998 | Arney et al. | 359/291 |
| 5,840,597 A * | 11/1998 | Hartauer | 438/52 |
| 5,846,849 A * | 12/1998 | Shaw et al. | 438/52 |
| 6,136,211 A * | 10/2000 | Qian et al. | 216/37 |
| 6,149,190 A * | 11/2000 | Gavin et al. | 280/735 |

OTHER PUBLICATIONS

Shaw et al., "SCREAM I: a single mask, single–crystal silicon, reactive ion etching process for microelectomechanical structures," *Sensors and Actuators A*, vol. 40, pp. 63–70, 1994.

Arnold et al., "Changing of pattern features during plasma etching," *J. Appl. Phys.*, vol. 70, No. 10, pp. 5314–5317, Nov. 1991.

Li et al., "Fabrication of a Single Crystalline Silicon Capacitive Lateral Acclerometer Using Micromaching Based on Single Step Plasma Etching,"Proceedings, "IEEE, Micro Electro Mechanical Systems," IEEE Catalog No. 95CH3574, pp. 398–403, Amsterdam, the Netherlands, Jan. 29–Feb. 2, 1995.

Nozawa et al., "The Elctron Charging Effects of Plasma on Notch Profile Defects, "*Jpn. J. Appl. Phys.*, vol. 34, No. 4B, Pt. 1, pp. 2107–2113, 1995.

Kinoshita et al., "Notching as an example of charging in uniform high density plasmas," *J. Vac. Sci. Technol. B.*, vol.14, No. 1, pp. 560–565, 1996.

Li et al., "SIMPLE—A technique od silicon micromachining using plasma etching," *Sensors and Actuators A*, vol. 57, pp. 223–232, 1996.

Maruyama et al., "Reduction of Charge Build–up eith High–Power Pulsed Electron Cyclotron Resonance Plasma," *Jpn. J. Appl. Phys.*, vol. 36, No. 4B, Pt. 1, pp. 2526–2532, 1997.

Hwang et al., "On the origin of the notching effect during etching in uniform high density plasmas," *J. Vac. Sci. Technol. B*, vol. 15, No. 1, pp. 70–87, 1997.

* cited by examiner

Variable $Z_O$

PLASMA ETCH TECHNIQUES FOR FABRICATING SILICON STRUCTURES FROM A SUBSTRATE

This application claims the benefit of U.S. Provisional Application No. 60/106,251, filed Oct. 30, 1998, the entirety of which is incorporated by reference.

This invention was made with U.S. Government support under ARO Contract No. DAAH04-95-1-0093. The U.S. Government has certain rights in this invention.

BACKGROUND OF THE INVENTION

This invention relates to processes for etching silicon substrates, and more particularly relates to etch techniques for producing mechanical structures, or elements, on or out of a silicon substrate.

The broad class of etch techniques known collectively as micromachining are now commonly employed to etch silicon substrates and related electronic materials to produce mechanical and electromechanical elements and systems. In addition to its well-known electrical properties, silicon has been found to exhibit superior mechanical properties. As a result, silicon is routinely employed for both electrical functionality and structural support in micromachined sensor and actuator systems.

Historically, two classes of micromachining etch techniques have been applied to silicon. In a first class, known as surface micromachining, layers of material, e.g., silicon dioxide and polycrystalline silicon (polysilicon), are applied to the surface of a silicon substrate and etched to form suspended mechanical and/or electrical elements that are attached to the substrate, or to form free elements that are removed from the substrate or held captured by other structures. The second etch technique class, known as bulk micromachining, employs processes for etching a single crystal silicon substrate itself to produce mechanical and/or electromechanical elements out of the substrate. This enables the production of suspended or free elements that are integral to the substrate.

For many applications, it is preferred that a mechanical or electromechanical element be formed of single crystal silicon rather than polysilicon. Single crystal silicon is mechanically more robust than polysilicon, and single crystal silicon exhibits superior electrical properties over that of polysilicon. As a result, an electromechanical element that is formed of single crystal silicon is in general expected to provide a range of performance advantages over a corresponding polysilicon electromechanical element.

Of particular interest is the ability to produce single crystal silicon elements that are free to move vertically and/or horizontally and that are mechanically attached to and accessible at the surface of a silicon substrate in the manner of surface-micromachined elements. This enables an electromechanical sensor and actuator configuration with processing and input/output electronics integrated locally on the same substrate. Such a configuration captures the advantages of surface micromachining, in its unobstructed access to surface elements, and of bulk micromachining, in its formation of single crystal silicon elements.

There have been proposed a wide range of processes for bulk micromachining a silicon substrate, including both wet and dry etch processes. A requirement of integration of electronics on the same substrate from which an element is to be etched places severe restrictions on the applicability of many etch processes, however; the electronics' materials must be securely masked from or be completely impervious to the substrate etch environment. Conventional wet etch techniques are typically found to not enable this integration requirement because it is generally not possible to adequately mask substrate electronics from wet etch conditions without degrading the electronics' material integrity.

Plasma and other dry etch processes have been proposed for overcoming the inherent limitations of wet etch conditions in bulk micromachining a silicon substrate on which electronics are integrated. Dry etch processes generally have been found to require either exotic and complicated masking and etch parameters or to not enable the degree of dimensional control that is required for many sensor and actuator applications. As a result, electromechanical, micromachined silicon elements, and particularly single crystal silicon elements, cannot be routinely fabricated with integrated electronics for addressing many sensor and actuator applications.

SUMMARY OF THE INVENTION

The invention enables the production of silicon structures using bulk micromachining plasma etch techniques. The invention specifically provides plasma etch processes that can be employed to etch both vertical trenches that define the lateral geometry of a silicon element as well as horizontal release areas under the silicon element to thereby form a suspended and mechanically moveable structure that can be employed as, e.g., an electromechanical actuator or sensor.

In the etch method of the invention, first a substrate configuration is provided that includes a silicon layer having a first face and a thickness corresponding to a specified thickness of the silicon element that is to be formed. The configuration further includes a layer of an electrically-insulating material located below and adjacent to the silicon layer. A substantially vertical trench is etched from the first face in the silicon layer to a depth that exposes the insulating layer. Then the trench in the silicon layer is exposed to a gaseous environment that is reactive with silicon, to substantially lateral etch the silicon layer preferentially at the depth of the insulating layer along a surface of the insulating layer. This lateral etch is continued for a duration that results in release of a silicon element over the insulating layer.

In accordance with the invention, this release of a silicon element can be complete, in that the element is fully separate and free from the silicon layer and thus can be completely removed from the silicon layer; or can be partial, in that the element is suspended over the insulating layer and can move in at least one direction, but is anchored to the silicon layer at at least one point. For example, the process of the invention enables the fabrication of a silicon doubly-supported or cantilever beam, or a pair of interdigitated fingers, suspended over the insulating layer.

The electrically-insulating material can be provided as, e.g., silicon dioxide that is grown, a deposited layer of silicon nitride, a spin-applied polymer, or other suitable material. The substrate configuration can be provided by, e.g., forming the electrically-insulating layer on a first silicon substrate; bonding a second silicon substrate to the formed insulating layer; and then thinning the second silicon substrate to the specified silicon element thickness. Alternatively, there can be formed a polysilicon layer of the specified silicon element thickness on the insulating layer.

In preferred embodiments, the reactive gaseous environment is a plasma environment characterized as being an anisotropic silicon etchant. In one example, the reactive gaseous environment is provided as alternating time intervals of a first environment comprising $SF_6$ and a second environment comprising $C_4F_8$.

In accordance with the invention, it is contemplated that the lateral edges of the silicon element be photolithographically defined; these edges to be formed by the vertical trench etch in the silicon layer. In one example the photolithographic definition of the silicon element's lateral edges is a photolithographic definition of a lateral anchor from the silicon element to the silicon layer. Here the step of reactive gaseous environment exposure of the silicon layer is carried out until the silicon element is vertically suspended over the insulating layer but laterally anchored to the silicon layer. In a further example, photolithographic definition of the silicon element's lateral edges is a photolithographic definition of a trench that completely circumscribes the silicon element. In this case the step of reactive gaseous environment exposure of the silicon layer is carried out until the silicon element is completely released from the silicon layer.

One particular advantage of the etch process of the invention is the ability to integrate microfabricated electronics on the substrate configuration. In one example process, electronics are fabricated on the silicon layer, and then electronics are coated with a removable protective coating, prior to the trench exposure to the reactive gaseous environment. The protective coating is removed from the electronics after production of the silicon element. In one example process, an electrical interconnection is formed between the silicon element and the electronics.

To enable electrical insulation of the silicon element, it can be coated with an electrically insulating film. To provide the ability to make a back side electrical contact to the silicon layer, there is provided a process in which a via is etched from a back side of the substrate configuration through the insulating layer to expose the silicon layer. An electrically conducting layer is then formed in the via.

In another aspect, the invention provides a process for etching an angled trench in a silicon layer. In this process, a substrate configuration is provided, including a first silicon layer having at least one trench etched through the first silicon layer, and layer of an electrically-insulating material located below and adjacent to the silicon layer. The insulating layer includes an aperture that is located at a non-central location with respect to the trench and that corresponds to a prespecified trench angle. The configuration further includes a second silicon layer, in which the angled trench is to be formed, below and adjacent to the insulating layer. The trench in the first silicon layer is exposed to a gaseous environment that is reactive with silicon to etch that region of the second silicon layer that is exposed by the aperture in the insulating layer to a selected angled trench depth and prespecified trench angle.

Once the one or more angled trenches are formed in the second silicon layer, the first silicon layer and the insulating layer can be removed. This results in a substrate having angled trenches at its face.

As with the process described above, the electrically-insulating material can be provided as silicon dioxide, silicon nitride, a polymer, or other suitable material.

The substrate configuration for etching the angled trenches can be provided by a wide range of processes. For example the electrically-insulating layer can be on a first silicon substrate and then patterned to produce an aperture in the insulating layer. A second silicon substrate can then be bonded to the insulating layer. At least one trench is then etched in the second silicon substrate.

A principle advantage of silicon element formation method of the invention is that lateral geometric definition of structures, micromachining release, and dielectric passivation of a released single crystal silicon structure can all be accomplished in one piece of fabrication equipment, using a sequence of all-dry processes. Both the equipment and dry process sequence are completely compatible with conventional circuit fabrication such as CMOS and bipolar processing. This enables fabrication of mechanical and electrical structures on a common fabrication substrate and with a common fabrication facility. The angled trench etch method of the invention overcomes the severe constraints typically associated with angled etch techniques, and provides a wide range of design options for microelectromechanical structure features.

Other applications, features, and advantages of the invention will be apparent from the following description and associated drawings, and from the claims.

DETAILED DESCRIPTION OF THE INVENTION

Figure 1A:
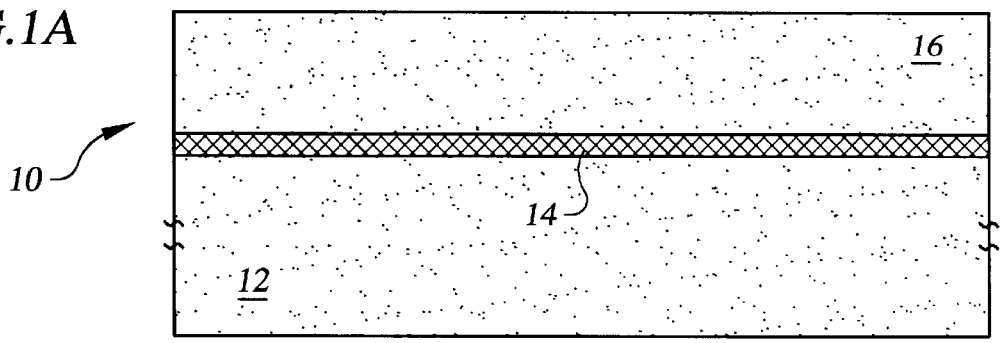
FIGS. 1A–1G are schematic cross-sectional views of a substrate configuration undergoing a first set of fabrication steps of the plasma etch process of the invention for producing a silicon element.

Referring to FIG. 1A, there is shown a cross-sectional view of a substrate configuration 10 to be provided in accordance with the invention for carrying out the plasma etch processes of the invention. The substrate configuration 10 comprises a bulk substrate portion 12, a layer 14 of insulating material, i.e., a dielectric layer, atop the bulk portion 12, and an upper substrate portion 16 in which is to be micromachined a silicon element.

The invention exploits this structure to enable a plasma etch technique in which the bottom region of the upper substrate portion 16, just above the insulating layer 14, is preferentially laterally underetched along the surface of the insulating layer when the insulating layer is exposed to a plasma environment for etching the upper substrate portion. Etching of one or more trenches in the upper portion 16 is carried out to provide such exposure of the insulating layer. With the trench and lateral underetching, a silicon element, e.g., a suspended beam, is micromachined out of the upper substrate portion. As a result, the thickness of the upper substrate portion 16, and correspondingly, the depth at which the insulating layer 14 is located, are to be selected based on the desired thickness of the silicon element to be produced.

The material compositions of the substrate portions and the insulating layer are to be selected based on the application of the micromachined element. If the micromachined element is to be single crystal silicon, and/or if silicon electronics are to be integrated with the micromachined element, then the upper substrate portion 16 is preferably a single crystal silicon layer. If electronics are not to be fabricated in the upper substrate portion, or if the micromachined element need not exhibit a single crystal morphology, then the upper substrate portion can be formed as polysilicon or other suitable material.

Whether single crystalline or polycrystalline, the upper substrate portion preferably is characterized by some degree of electrical conductivity, which enables the lateral etch process of the invention. The upper substrate portion can be electrically doped p-type or n-type, of any suitable dopant level, taking into consideration the requirements of electronics fabrication. The bulk substrate portion 12 can be formed of a convenient material that is compatible with the production of a selected upper substrate portion and underlying insulating layer. A single crystal silicon wafer can thus be preferred for many applications, but other substrates, including, e.g., quartz or plastic, can be suitable.

To enable the lateral plasma underetch process of the invention, the insulating layer 16 is preferably a good insulator. For convenience, the insulating layer is preferably compatible with silicon fabrication technology and further is preferably not corrupted by an electronics fabrication sequence. The insulating layer can consist of, e.g., silicon dioxide, silicon nitride, a mixture of oxides, a polymer such as photoresist or polyimide or a fluorocarbon, an insulating ceramic such as alumina, magnesium oxide, or other suitable insulating material. The material is preferably a high-quality insulator; a material that approaches the electrical characteristics of a perfect insulator is optimal. A combination of insulating material layers, such as a silicon dioxide-silicon nitride layer combination, can also be employed. Such can be advantageous for controlling mechanical stress through the thickness of the substrate.

There are several considerations for selection of the insulating layer thickness. First, because the lateral plasma underetch process of the invention is based on an electronic charging of the insulating layer, as explained in detail below, it is preferred that the insulating layer be of a thickness that minimizes charge leakage. In addition, for the given properties of a selected insulating material, the insulating material layer is preferably of a thickness sufficient to withstand damage during the plasma etch, so that at least some portion of the layer remains for the full etch duration. Further, the thickness of the insulating layer is directly related to the lateral etch rate, and thus can be selected based on a desired process efficiency.

For most insulating materials, the insulating layer need not be more than about 1 $\mu$m in thickness to provide adequate electronic charge control, but thicknesses greater than 1 $\mu$m can be employed if desired. For some materials, only a relatively thin layer can be easily produced and is sufficient. Silicon nitride, for example, cannot be deposited to thicknesses of more than about 3000 Å, and no more than about 3000 Å is required or preferred for enabling the etch process of the invention. A minimum thickness of about 1000 Å is preferred for most insulating materials; below this thickness, the insulating layer typically is severely damaged by the plasma etch environment.

With these stipulations, a wide range of substrate configurations can be employed for the plasma etch process of the invention. The invention does not require that the substrate configuration be permanent; the upper substrate portion can be either permanently or removeably attached to the insulating layer, and the lower substrate portion can be either permanently or removeably attached to the insulating layer.

In a first example, a silicon-on-insulator (SOI) wafer configuration can be provided. Here both the bulk and upper substrate portions are provided as single crystal silicon, and the insulating layer is provided as silicon dioxide. A SOI wafer configuration can be produced by depositing or growing silicon dioxide on a first silicon wafer and then fusion bonding a second wafer to the silicon dioxide layer. If a permanent substrate configuration is not desired or required, the second wafer need not be fusion bonded to the silicon dioxide layer and instead can be simply held against the layer by the naturally-occurring Van de Waals forces that are generated during a cleaning process.

Wet thermal growth of silicon dioxide is preferred, but dry thermal growth, as well as chemical vapor deposition, can also be employed. Thermal growth of the silicon dioxide layer is preferred because the resulting smoothness of the layer surface enables ease of contacting to the upper substrate portion and at the end of the etch process, if the substrate configuration was not annealed, enables ease of separation of the upper substrate portion, should such be desired. Insulating layers produced by chemical vapor deposition are typically characterized by a high degree of surface roughness that does not enable effective bonding with an upper substrate portion. It is therefore preferred that a polishing process be carried out on the insulating layer if the insulating layer is formed by chemical vapor deposition.

If permanent fusion bonding of the substrate configuration is desired, a conventional bonding process is to be carried out. In one example process, the first wafer and its silicon dioxide layer, and the second wafer, are cleaned by a standard RCA cleaning process, and then the second wafer is brought into contact with the silicon dioxide layer after alignment, if such is necessary. The contact is preferably made under vacuum or other pressure. Then the contacted structure is annealed, typically in an inert gas, at a temperature and for sufficient time that bonding occurs. In one example, an anneal cycle at a temperature of about 1100° C. is carried out for about 1 hour.

With the SOI structure completed, the second wafer can then be thinned to a thickness that corresponds to the silicon element to be micromachined. Such thinning can be accomplished by, e.g., chemo-mechanical polishing, chemical etching, or other conventional process.

As can be recognized, a wide range of other substrate configurations can be employed. For example, a SIMOX (Separation by IMplantation of OXygen) can be employed, if an upper silicon portion of about 0.4 $\mu$m in thickness, which is typical for SIMOX structures, is adequate for the thickness of the element to be micromachined. In another example process, a polymer film can be spin-applied to a first wafer and then a second wafer attached to the polymer film, preferably accompanied by a short heating cycle. This temporary attachment enables ease of removal of the second wafer after the etch process if such is desirable.

Whatever the insulating material composition, the invention contemplates the patterning of the insulating layer prior to the formation of an upper substrate portion on the insulating layer. As shown in detail below, the lateral plasma underetch process of the invention requires the provision of an insulating layer only at locations where micromachined structures are to be formed in the upper substrate portion; other regions of the upper substrate portion need not be located atop an insulating layer. As a result, the insulating layer can be patterned, using conventional photolithographic techniques, to provide only regions of insulation, if desired. The upper substrate portion, if provided by a wafer, can be bonded to the insulating layer regions, or can be bonded to a combination of insulating layer regions and lower substrate regions exposed by patterning of the insulating layer.

For a wide range of insulating materials, the upper substrate portion need not be provided as a wafer and instead can be formed as a layer of, e.g., polysilicon, deposited on the insulating layer to provide the upper substrate portion. In such a scenario, it is preferred that the morphology of the deposited upper layer, e.g., the polysilicon morphology, be selected to provide adequate mechanical and electrical properties for the element to be machined from the polysilicon layer. If necessary, a polysilicon layer preferably is doped to ensure an adequate degree of electrical conductivity.

Figure 1B:
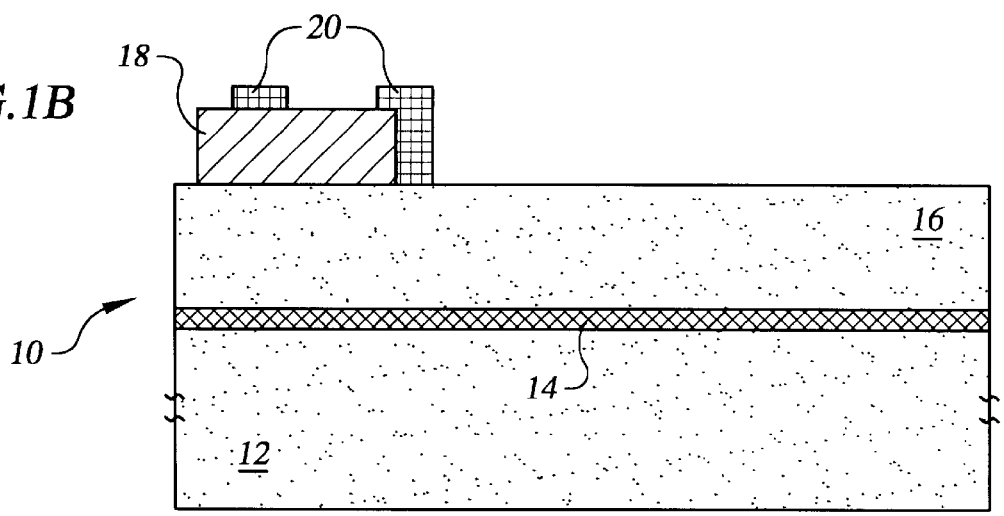

Referring to FIG. 1B, with the formation of the substrate configuration 10 complete, CMOS, bipolar, or other monolithic electronics 18 can be fabricated in the upper substrate portion 16, in the conventional manner, if such is desired. Mechanical structures can also be produced in the upper substrate portion, if desired. The invention does not require the fabrication of electronics, but is extremely well-suited for enabling the fabrication of conventional electronics along with micromachined structures on a common substrate and in a conventional fabrication environment. Conventional metallization 20 of the circuitry can be provided in the usual manner.

Figure 1C:
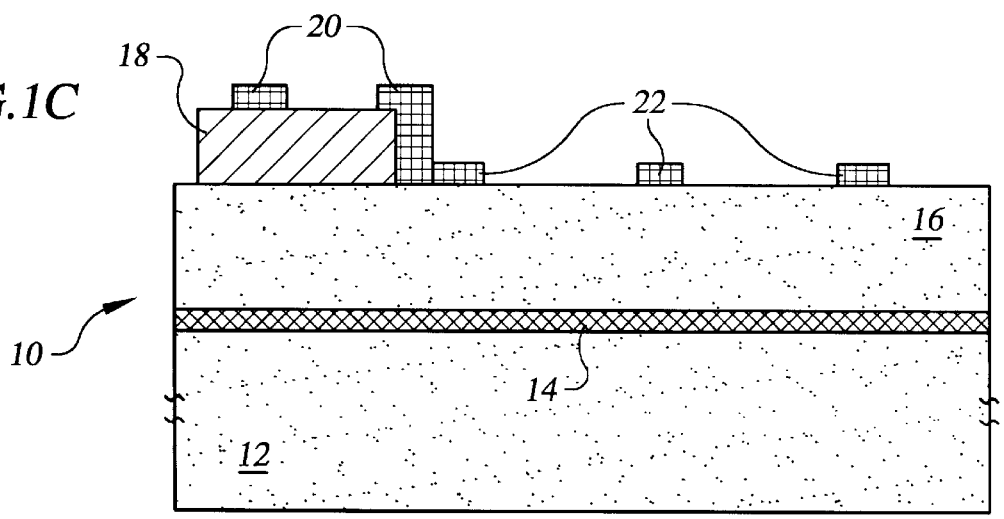
Figure 1D:
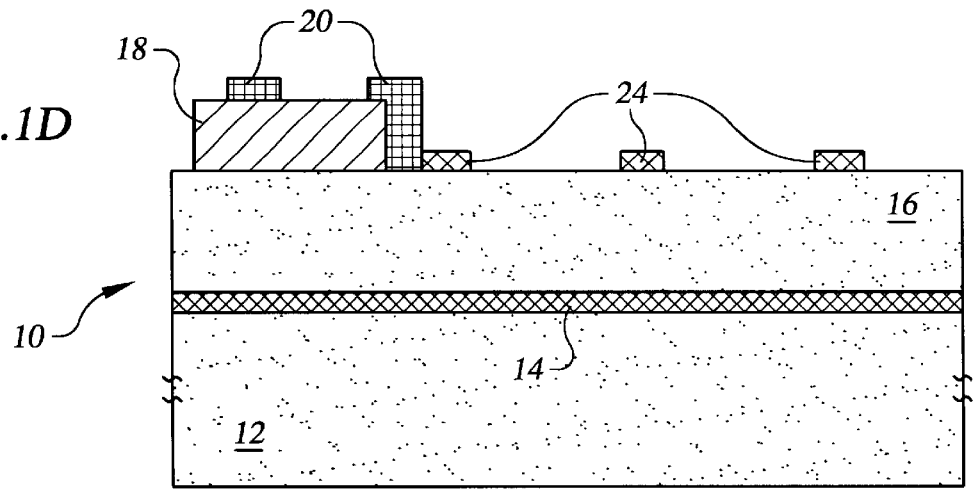

Referring to FIGS. 1C and 1D, metallization 22 or 24, respectively, can then be provided for making electrical contact to the micromachined structure or structures to be etched from the upper substrate portion. In a first example scenario, micromachined structure interconnects 22 are formed by the circuitry metallization step; in an alternative scenario, the structure interconnects 24 are formed by a separate process. In either case, the metallization pattern to the micromachined structure locations is that pattern required for, e.g., electrical connection of the structures to the circuitry, to power supplies, input/output contact pads, packaging connections, or other electrically conductive paths required for electrical actuation of the structures or delivery of sensing signals from the structures. If the structures to be micromachined from the upper substrate portion do not require electrical actuation, then this metallization step is not required.

The metallization can be produced using conventional techniques, for example, with conventional sputter, electroplating, or other metallization processes. Preferably the metallization material and its formation process are compatible with standard microfabrication techniques such that the entire micromachining process of the invention can be carried out in a conventional electronics fabrication environment. In one preferred metallization process, chromium and aluminum are deposited and patterned in a conventional lift-off process. As can be recognized, other metallization techniques can be employed.

Figure 1E:
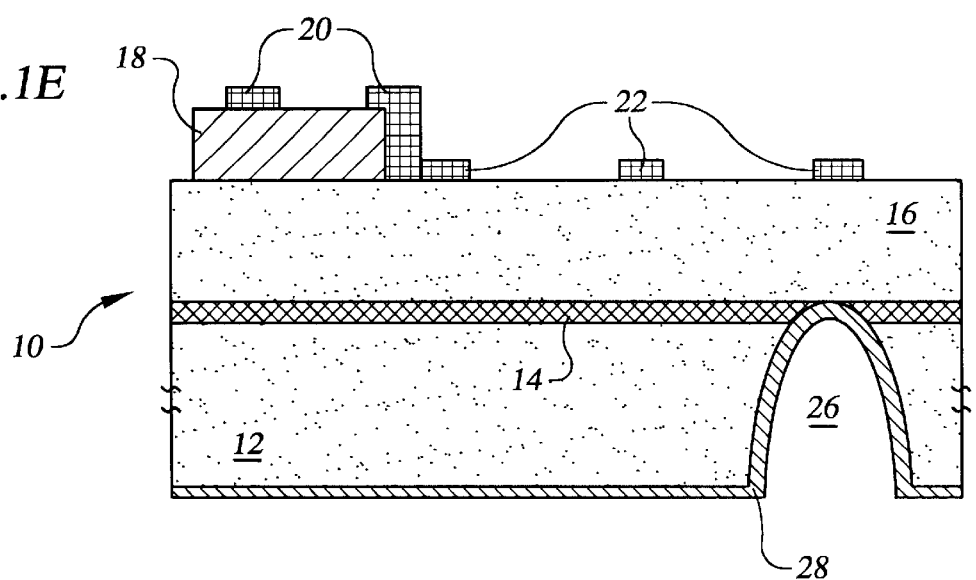

Referring to FIG. 1E, the invention contemplates adaptations of the substrate configuration 10 to enable both front-side and back-side electrical contact to an element that is micromachined from the upper substrate portion 12. In one example scenario, a backside via 26 can be etched through the lower substrate portion 12 and through the insulating layer 14 to access the upper substrate portion 16. Such a via etch can be carried out by, e.g., a conventional plasma or wet bulk etch process. Once the backside via 26 is formed, a conductive layer 28, e.g., a layer of polysilicon, can be deposited on the back side of the lower substrate portion 12 and the via 26.

It is to be recognized that during the via etch and conductive layer formation, the upper surface of the wafer configuration, and in particular the electronics, are to be well-masked. This can be accomplished in the conventional manner by coating the front face of the substrate configuration with a sufficiently thick layer of photoresist or other protective coating. The back face of the substrate configuration is then coated with a layer of photoresist that is then patterned to define the via. The via is then etched through the bulk silicon portion from the back face of the substrate configuration, and a wet buffered oxide etch, dry plasma etch, or other suitable process is employed to etch through the insulating layer exposed by the via etch. If desired, a shallow etch of the upper substrate portion exposed by etch of the insulating layer can then be carried out. With the completion of this etch, the photoresist layers on the back and front faces of the substrate configuration are then removed.

Figure 1F:
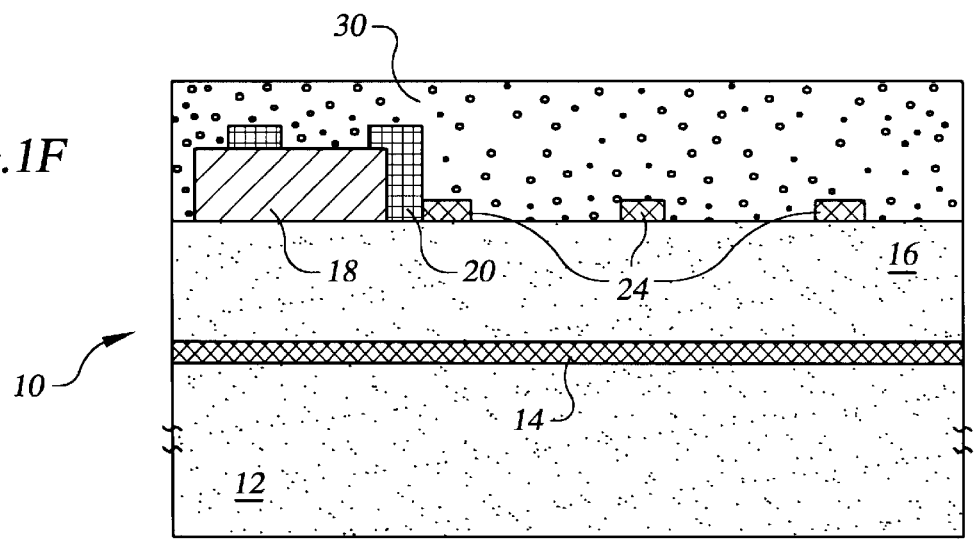

Referring to FIG. 1F, with circuitry fabrication and metallization complete, a layer 30 of photolithographic masking material is deposited over the circuitry 18 and metallization 20, 24. FIG. 1F shows an example configuration in which no backside contact via is included as in FIG. 1E, but it is to be recognized that the via configuration of FIG. 1E can be included if desired.

The masking layer 30 preferably serves dual purposes. First, the masking layer preferably is employed as a photolithographic mask for defining the locations of trenches to be etched in the upper substrate portion 16. Second, the masking layer 30 preferably serves as a mask to protect the circuitry 18 and metallization 20, 24 during the substrate etch to follow. Depending on the topology of the circuitry and metallization, a standard photoresist can generally be employed as both the photolithographic and protective masking layer.

In one example, the positive photoresist AZ4620 from Hoecht can be employed, and can be deposited to a thickness of up to about 11 $\mu$m, which is generally sufficient for even very large topology configurations. Other soft masking materials can be employed, including, e.g., polyimide or other polymer that can be photolithographically patterned. It is preferable that the selected photoresist be characterized for the plasma etch recipe to be employed such that sufficient masking of the layer to the plasma etch environment is guaranteed for a given process. If desired, a hard mask can alternatively or in addition be employed, including, e.g., a layer of silicon dioxide or silicon nitride, in the conventional manner.

Figure 1G:
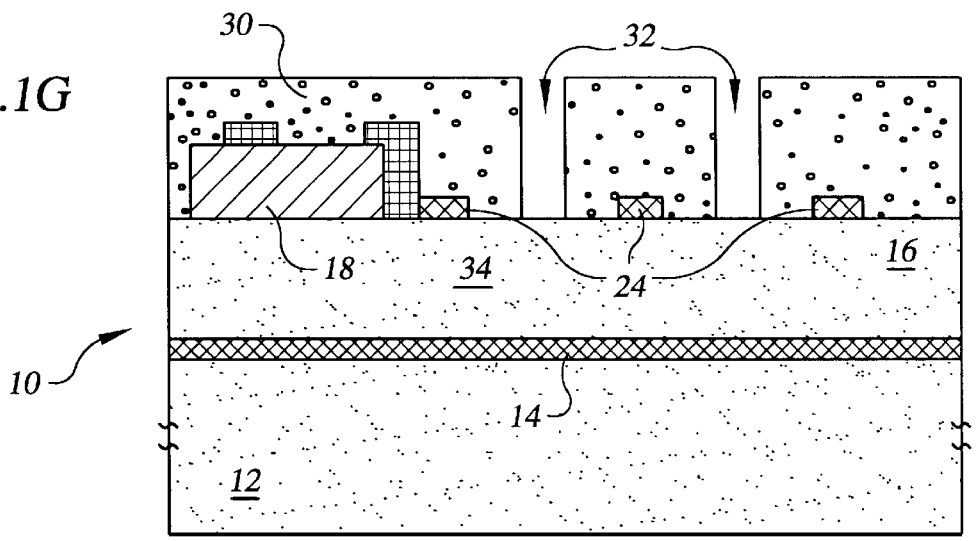

Referring to FIG. 1G, the masking layer 30 is then photolithographically patterned to define trench openings 32 corresponding to locations in the upper substrate portion 16 in which a trench is to be etched. Conventional photolithography, as well as customized lithographic techniques, can be employed. The trench pattern is to define trench locations adjacent to the portion 34 of the upper substrate region 16 that will become a micromachined element, and thus to define the lateral geometry of the silicon element. The trenches also define in the upper substrate portion lateral gaps across which the micromachined element can be actuated. The trenches alternatively can be employed for completely releasing an element from the substrate configuration, if the trenches completely circumscribe an element region.

Figure 1H:
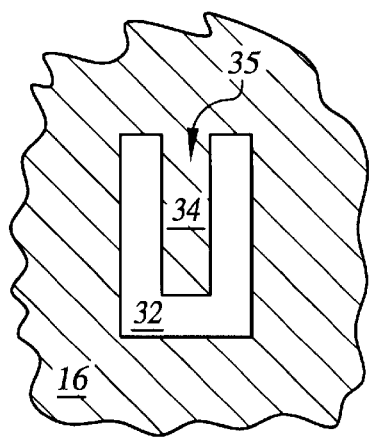
FIGS. 1H–1J are schematic top-down plan views of three example silicon element configurations corresponding to a pattern produced on the substrate configuration in its state shown in FIG. 1G.
Figure 1I:
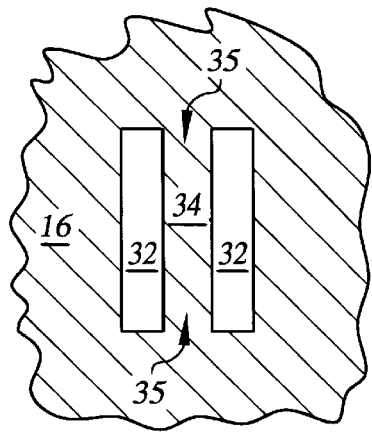

FIGS. 1H and 1I provide top-down plan views corresponding to the first scenario, in which a micromachined element remains anchored to the substrate while free to be actuated across a lateral trench gap. In FIG. 1H there is shown a micromachined element 34 that is a beam defined by a trench 32 between the beam and the surrounding material in the upper substrate portion 16. The trench 32 does not completely circumscribe the beam 34; an anchor point 35 is provided at one end. The beam can be actuated laterally across the trench region 32 and can be actuated horizontally upward, and to a lesser extent, downward. In a similar configuration, there is shown in FIG. 1I a micromachined element 34 that is a doubly-supported beam defined by the trench 32 between the beam the upper substrate portion 16. Here the trench 32 is formed as two distinct trench regions that define two anchor points 35 acting as beam supports. Note in FIG. 1G that the metallization 24 is to be provided at locations corresponding to the intended geometry of the micromachined element such that a conducting path can be provided from the micromachined element across the element anchor to other regions of the substrate.

Figure 1J:
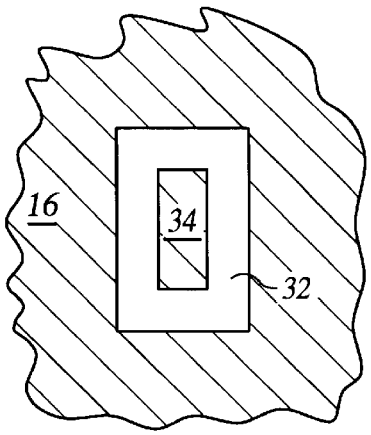

There is shown in FIG. 1J the alternative micromachined element scenario, here in which the trench 32 is defined to completely circumscribe the element 34. In this case, the plasma etch of the invention results in complete release of the element 34 from the upper substrate portion 16. This can be advantageous for producing in batch fashion a large number of components to be employed in a system or systems. The masking layer 30 can be patterned to include one or more anchored elements such as the examples in FIGS. 1H and 1I as well as completely released elements like that in FIG. 1J, all on the same upper substrate portion 16.

Figure 1K:
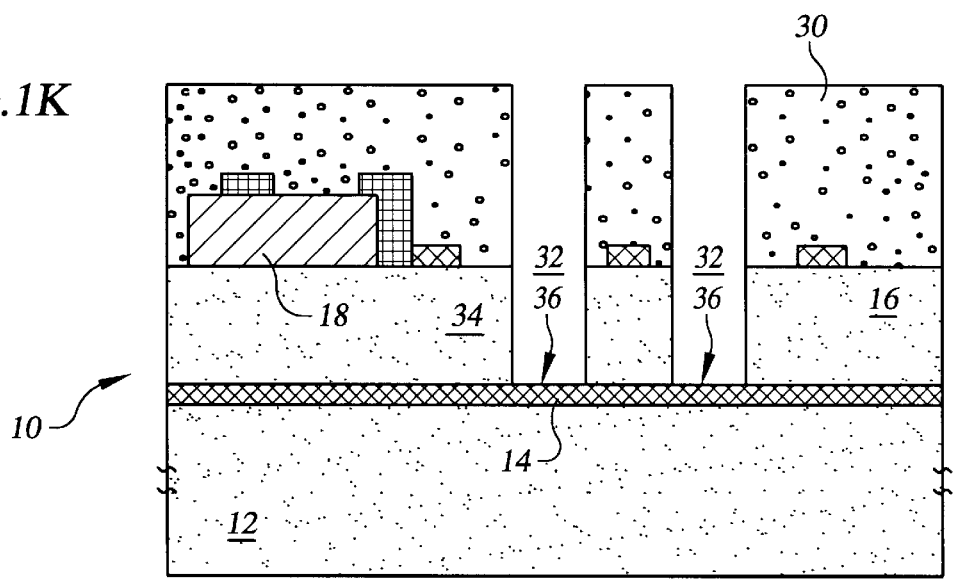
FIGS. 1K–1O are schematic cross-sectional views of a substrate configuration undergoing a final set of fabrication steps of the plasma etch process of the invention for producing a silicon element.
Figure 1L:
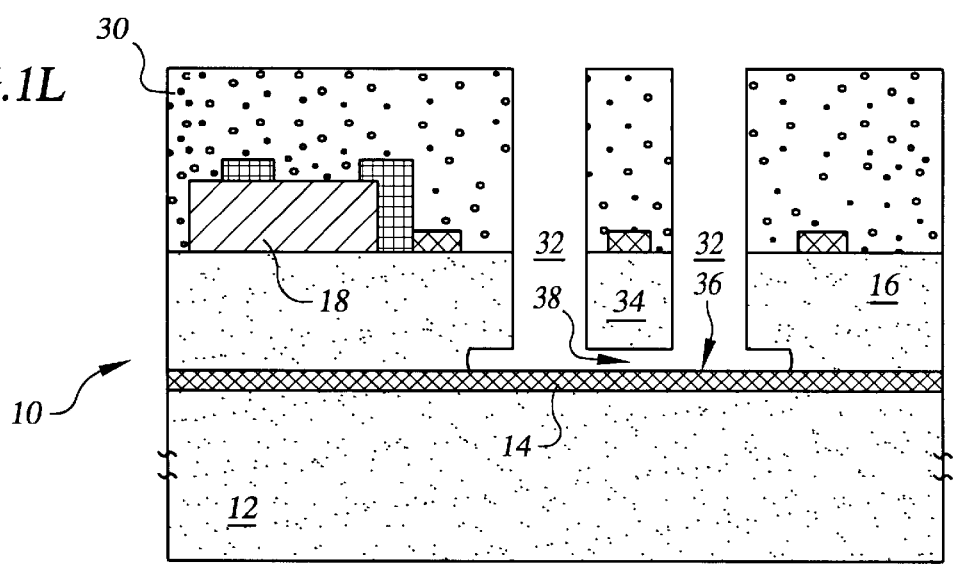

Referring to FIG. 1K, with the masking layer 30 patterned, the silicon plasma etch of the invention is then carried out to etch a trench or trenches 32 in the upper substrate portion 16 to a depth that exposes the top surface 36 of the insulating layer 14. The etch is then continued, referring to FIG. 1L, to laterally underetch a bottom region 38 of the upper substrate portion 16. This effectively underetches a silicon element 34 consisting of the substrate portion that remains over the etched region 38. At the completion of the lateral underetch, as shown in FIG. 1L, the micromachined element 34 is fully formed and exhibits various lateral and/or vertical degrees of freedom corresponding to the trench pattern defined in the masking layer 30. If the trench pattern does not completely circumscribe an element 34 in the upper substrate portion, then the underetch results in a suspended structure that is anchored to the upper substrate portion at the point or points along its periphery where no trench exits. If the trench pattern does completely circumscribe an element, then the underetch results in the complete release of the element from the substrate.

The lateral underetch process of the invention is enabled by localized plasma etch conditions that result from the influence of the trench aspect ratio and the exposed insulating layer on the plasma constituents. For reliable, repeatable underetching of silicon elements, it is preferred that the insulating layer be formed of a good-quality insulator of sufficient thickness, e.g., as a 0.5 $\mu$m-thick silicon dioxide layer; that the etched trench have an aspect ratio of at least about 2:1, preferably at least about 3:1, referring to trench height versus trench width; and that the plasma be a directional reactive ion etch, preferably of high ion density.

During both the trench etch and lateral underetch, electrons in the plasma are directed to the substrate isotropically. But the flux of electrons to lower regions of the trench sidewalls and the bottom of the trench is limited by the reduced view factor to the plasma at those locations for trench aspect ratios greater than about 2:1. This electron flux limitation results in an accumulation of negative electrical charge at upper regions of the trench sidewalls and the masking layer, and produces a repulsive negative charge that further inhibits the flux of electrons to lower trench regions. In contrast, the ions of the plasma, which are positively electrically charged, are directed substantially downward, reaching the trench bottom.

Once the trench etch uncovers the insulating layer at the bottom of the trench, the insulating layer is charged electrically positive by the impact of the charged ions. Assuming that the insulating layer can be treated as perfectly insulating for simplicity of explanation, then the surface potential of the layer can be expected to evolve until an equal electron and ion flux is reached at all surface points. This charging of the insulator results in a potential difference between the upper trench regions and the lower trench regions that causes the build up of local electric fields. The electric fields deflect and redirect the positively charged ions away from the positively charged insulating layer at the trench bottom and toward the more negatively charged upper substrate portion.

The redirected ion flux peak is located at the interface between the insulating layer and the upper substrate portion. As a result, the continuing exposure of the substrate to the plasma environment, once the insulating layer has been exposed, causes lateral ion attack and a corresponding lateral underetch at the bottom of the upper silicon portion just along the top surface of the insulating layer. With trenches defined on more than one side of an element, this lateral attack and underetch proceeds inwardly from more than one direction, resulting in an efficient release of the element.

For each micron of lateral underetch, about 0.3 $\mu$m of vertical underetch occurs, on average for a range of etch parameters. With this metric, the thickness of the upper substrate portion 16 can be selected to produce a micromachined element of a desired height suspended above the underetched region. The aspect ratio of the etched trenches determines the particular lateral profile of the micromachined element. For relatively low aspect ratios, e.g., less than about 6:1, referring to trench depth versus trench width, the underside of the micromachined element is relatively flat. For relatively high aspect ratios, e.g., about 35:1, vertical etch of the center of the element underside is accelerated over that of the edges, resulting in a reverse cone geometry.

Note as shown in FIG. 1L that the underetch proceeds in all lateral directions; in other words, the underetch progresses outwardly from all edges of the trench wherever an insulating layer is provided under the upper substrate portion 16, including directions opposite the element being micromachined. For most applications, this is found to be acceptable. But referring also to FIGS. 2A–C, the invention contemplates alternative scenarios for controlling the extent of lateral underetch under the substrate portion 16. In a first general scenario shown in FIG. 2A, the insulating layer 14 can be provided with discontinuities 15 at various locations. So long as the insulating layer is provided at regions immediately adjacent to the trench location, the underetch proceeds laterally under the substrate portion at those regions.

Figure 2A:
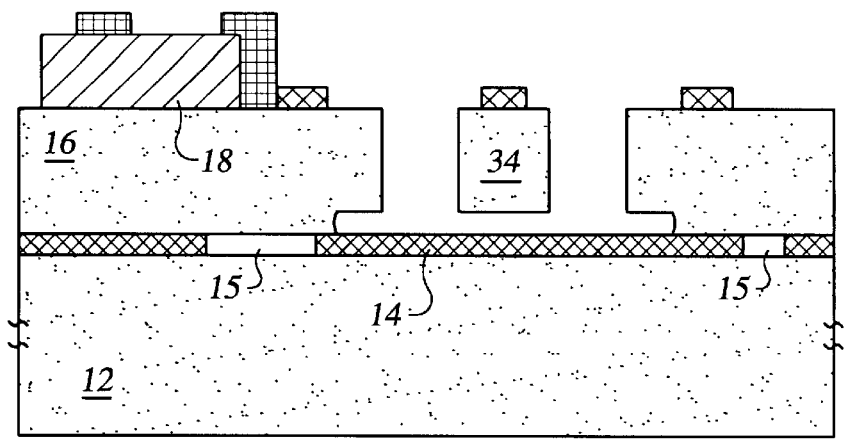
FIGS. 2A–2C are schematic cross-sectional views of three example configurations of an insulating layer that can be employed in the fabrication process of FIGS. 1A–1O.
Figure 2B:
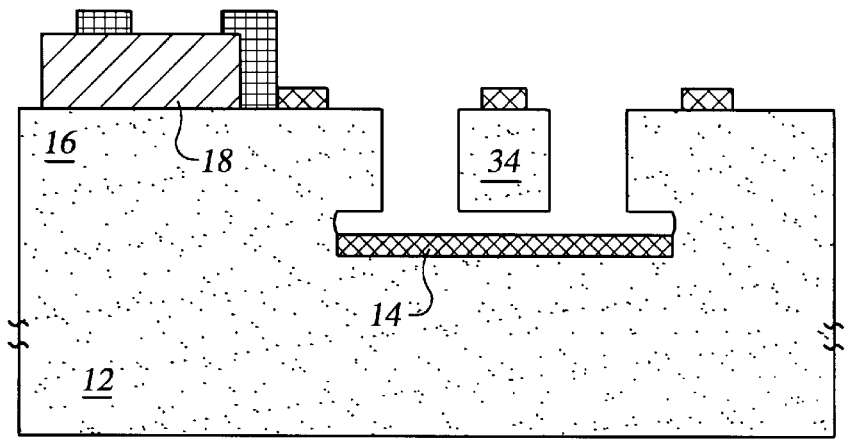
Figure 2C:
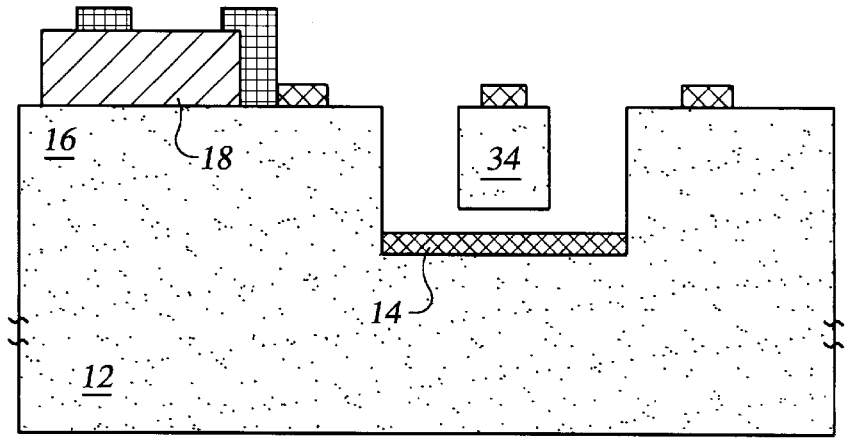

Referring to FIG. 2B, the insulating layer need not extend to the edges of the substrate. As shown, the insulating layer can instead be provided only at those regions where a micromachined element is to be produced. If the layer extends beyond the edge of the trench, the lateral underetch will proceed along the layer, generally for a distance corresponding to about one-half the underetch under the micromachined element. Referring to FIG. 2C, the lateral underetch can be selectively terminated by providing an insulating layer that does not substantially extend beyond the trench edge. With this configuration, the underetch is inhibited from extending beyond the trench.

In the scenarios depicted in FIGS. 2A–C, the production of a substrate configuration can be conveniently accomplished by a bonding process in which a second silicon wafer is bonded to an insulating layer formed on a first silicon wafer. Conventional fusion bonding anneal schedules enable the bonding of the second wafer to both the insulating layer and the exposed regions of the first wafer. It is preferred that the two wafers be aligned prior to bonding to ensure that the insulating layer is correctly positioned with regard to the intended location of the element to be micromachined. Once bonding is complete, the first and second wafers fuse together in regions where the first wafer is exposed, resulting in a continuous bulk substrate between the upper and lower substrate portions.

Turning to particulars of the plasma etch environment, the plasma conditions employed for etching the trenches are also employed to carry out the lateral underetch of the invention; separate etch steps or etch conditions are not required, but can be employed if desired. A wide range of plasma chemistries and process conditions can be employed for the trench and lateral underetches. $SF_6$, $CHF_3$ and $O_2$, $CF_4$ and $H_2$, $NF_3$, $BF_3$, $PF_5$, and other suitable silicon etch chemistries can be employed. The invention does not require a specific etch chemistry. What is required are etch chemistry and plasma conditions that etch silicon selectively over the insulating layer's material and that preferably provide directional ions that can be influenced by the trench geometry and the insulating layer to produce the lateral underetch. If the etch chemistry includes or produces species that passivate the trench sidewalls, the etch conditions must enable removal of the passivation for etching of the lower sidewall regions by the plasma ions.

The etch chemistry and plasma conditions preferably are selected to provide a desired etch anisotropy for producing trench sidewalls of a desired vertical degree. A wide range of conventional plasma etch processes can be employed in accordance with the invention for producing desired trench etch anisotropy, including various selective polymer and oxide deposition processes. The etch processes of MacDonald et al., in U.S. Pat. No. 5,198,390 and U.S. Pat. No. 5,628,917, issued Mar. 30, 1993 and May 13, 1997, respectively; Shaw et al., in U.S. Pat. No. 5,719,073, issued Feb. 17, 1998; and Bartha et al., in U.S. Pat. No. 5,658,472, issued Aug. 19, 1997, are all hereby incorporated by reference; aspects of these etch processes are contemplated by the invention as providing techniques for high-anisotropy trench etches. In these processes, a masking layer is deposited to mask vertical trench sidewalls as a trench etch is continued. These process conditions can be employed for the lateral underetch of the invention with the provision of a buried insulating layer, provided by the invention, for directing the lateral underetch.

An example etch chemistry and plasma environment that are particularly well-suited for the trench etching and lateral underetching of the invention are described in the teaching of Laermer et al., U.S. Pat. No. 5,501,893, which is hereby incorporated by reference. Here is taught an etch method in which an $SF_6$ etch chemistry is employed alternately with a $C_4F_8$ masking polymerization chemistry that enables highly anisotropic trench etching. This can be preferred over the etch processes discussed just above in that the etching and masking steps are in this process carried out in a common chamber with species easily directed to the chamber. It is to be recognized that alternate etch and polymerization chemistries can be employed in for the alternating etch-passivation process. When such etch conditions are incorporated with the provision of a buried insulating layer as provided by the invention, highly anisotropic trenches as well as extensive lateral underetches can be produced in accordance with the invention.

A wide range of etch chemistries and plasma environments corresponding to the Laermer teaching can be obtained with and carried out in an etch chamber commercially available from Surface Technology Systems, Inc., of Redwood city, Calif., and such a chamber can be employed in accordance with the invention for carrying out the micromachining of the invention.

Considering example trench etch and lateral underetch steps in accordance with the invention that employ alternating $SF_6$ etch $C_4F_8$ masking stages, the following Table 1 provides is a range of parameters that can be employed:

TABLE I

Example Trench and Lateral Underetch Process Conditions

| Stage 1 - etch | |
| --- | --- |
| $SF_6$ flow rate | 70–140 sccm |
| Stage duration | 10–15 seconds |
| Substrate electrode power | 8–16 W |
| Coil electrode power | 500–800 W |
| Stage 2 - passivate | |
| $SF_6$ overlap flow | 70–140 sccm |
| $SF_6$: overlap duration | 0–1 seconds |
| $C_4F_8$ flow | 20–95 sccm |
| Stage duration | 6–11 seconds |
| Substrate electrode power | 0–6 W |
| Coil electrode power | 500–800 W |
| Automatic pressure control angle | 50–80° |

Note that the specification of $SF_6$ overlap flow and overlap duration in the second stage refers to a period of overlap of the delivery of $SF_6$ from the first stage to an initial duration of the second stage. The ranges of parameters given are found to produce various results for the lateral underetch step of the invention, depending on the insulating material composition and thickness, the upper substrate portion composition and thickness, the aspect ratio of the etched trenches, and the conditions of the chamber in which the process is carried out.

In this alternating two-stage process, ion impact and etching occurs during the first stage while surface masking occurs during the second stage. An etch stage subsequent to a masking stage removes the masking layer from horizontal surfaces but does not remove the masking from the vertical trench sidewalls. When the insulating layer of the invention is exposed at the bottom of an etched trench, the ions are redirected from the insulating layer to the lower trench sidewalls, from which the masking layer is removed. The ions then attack the interface between the upper substrate portion and the insulating layer to laterally underetch the upper substrate portion.

Given this etch mechanism, it is required by the invention that the etch stage parameters be selected to ensure that the ion species is sufficiently energetic to remove the masking polymer from the lower trench sidewalls so that the lateral underetch can proceed. It is found in general that up to a point, an increase in $SF_6$ flow rate promotes removal of etch byproducts and replenishing of etch species, thereby enhancing the lateral underetch of the invention. Beyond a point, however, an increase in $SF_6$ flow rate causes a pressure increase that is substantial. This increases the plasma electron temperature and decreases the plasma ion energy, resulting in suppression of the lateral underetch of the invention. The $SF_6$ flow rate is preferably optimized to provide highly energetic ion species that enable the lateral underetch of the invention.

The etching stage electrode power is similarly found to strongly influence plasma ion energy. An increase in power generally increases the ion energy and the efficiency of the lateral underetch. An increase in power also lowers the selectivity of the etch to the silicon, however. As a result, it is preferred that the power be at a level that is no higher than that which would etch away the exposed insulating layer during the lateral underetch. The etching stage coil power influences plasma density and charge flux. Relatively higher coil power levels are found to enhance the lateral underetch process over relatively lower coil power levels.

For the passivating stage, an increase in the flow rate of $C_4F_8$ results in a thicker passivation film and a reduced efficiency of the lateral underetch of the invention. It is therefore preferred that the flow rate of the passivating species be no higher than that required to enable a desired degree of anisotropy in production of a desired degree of trench vertical sidewall.

An increase in passivation stage electrode power and coil power generally result in an increase in lateral underetch efficiency up to a point; beyond that point a further increase can tend to inhibit the lateral etch due to an increase in molecular fragmentation. The passivation stage power is thus preferably not set arbitrarily high. The automatic pressure control angle (APC) modifies the pressure of the plasma environment and as explained above, can either enhance or suppress the lateral underetch of the invention, depending on the pressure level. The APC is preferably set at a level lower than that which would tend to retard the lateral underetch.

As explained above, the lateral underetch of the invention exploits the influence of trench geometry on the plasma environment. The aspect ratio of the etched trench strongly influences the capability of the lateral underetch step to micromachine the lower region of an upper substrate portion. Relatively higher trench aspect ratios, of at least about 3:1, referring to trench height versus trench width, are preferred for promoting the lateral underetch of the invention. As the aspect ratio is reduced, the deflection of etching ion flux to the lateral etch locations is diminished and the lateral etch rate is correspondingly reduced. An aspect ratio below about 2:1 does not generally enable the lateral underetching of the invention for most combinations of plasma chemistry and substrate compositions.

Within the broad range of etch parameters given above, the invention provides a first subrange of high-rate etch parameters and a second subrange of low-rate etch parameters. In each of these two ranges of processes, the passivation stage parameters include a specification of the overlap period from the first stage into the second stage of $SF_6$ flow, to be held during the overlap duration at the flow rate employed during the first stage. Given a trench defined to be about 64 μm in width, the high-rate etch recipe enables a vertical trench etch that proceeds at a rate of at least about 3 μm/minute and a lateral underetch that proceeds at a rate of at least about 0.3 μm/minute. The low-rate etch recipe enables a more controlled etch stop; for a trench defined to be about 64 μm in width, the low-rate etch recipe enables a vertical trench etch that proceeds at a rate of less than about 2 μm/minute and a lateral underetch that proceeds at a rate of less than about 0.15 μm/minute. Table II below provides the subrange of parameters for the high-rate etch recipe and Table III below provides the subrange of parameters for the low-rate etch recipe.

TABLE II

Example High-Rate Trench and Lateral Underetch Process Conditions

| Stage 1 - etch | |
| --- | --- |
| $SF_6$ flow rate | 105–140 sccm |
| Stage duration | 14–15 seconds |
| Substrate electrode power | 12 W |
| Coil electrode power | 600–800 W |
| Stage 2 - passivate | |
| $SF_6$: overlap duration | 0–1 seconds |
| $C_4F_8$ flow | 20–90 sccm |
| Stage duration | 6–11 seconds |
| Substrate electrode power | 2–6 W |
| Coil electrode power | 600 W |
| Automatic pressure control angle | 65° |

TABLE III

Example Low-Rate Trench and Lateral Underetch Process Conditions

| Stage 1 - etch | |
| --- | --- |
| $SF_6$ flow rate | 70–140 sccm |
| Stage duration | 10–12.5 seconds |
| Substrate electrode power | 8–16 W |
| Coil electrode power | 600 W |
| Stage 2 - passivate | |
| $SF_6$: overlap duration | 0–1 seconds |
| $C_4F_8$ flow | 20–95 sccm |
| Stage duration | 6–11 seconds |
| Substrate electrode power | 6 W |
| Coil electrode power | 600 W |
| Automatic pressure control angle | 50–65° |

It is to be recognized that the invention does not require the specific example etch processes outlined above; etch species other than $SF_6$ and passivating species other than $C_4F_8$ can be employed. Passivating species such as $C_2F_6$, $C_3F_6$, $C_2F_4$, $C_5F_8$, $CHF_3$, and other suitable species that provide a passivating layer can be employed. But in general, alternating etch and passivation cycles are not required to carry out the trench and lateral underetch steps of the invention. All that is required is a silicon etch of a selected anisotropy and a plasma environment including ions of sufficient energy to remove, from the bottom of the trench sidewall, any passivation species located there, to enable a lateral underetch by redirection of the ions to the bottom of the sidewall.

Referring back to FIG. 1L, once the vertical trench and lateral underetches of the invention are completed, a silicon element is fully micromachined from the upper substrate portion. If the trench etch did not fully circumscribe the region corresponding to the silicon element, then a suspended element that is anchored to the upper substrate portion at one or more points is produced.

If the trench etch fully circumscribed the region corresponding to the silicon element in the upper substrate portion, then fully released elements are available for manual manipulation and collection. The enlarged trench that results in the upper substrate portion from removal of a fully released element can be employed in accordance with the invention for producing large actuation gaps as well as features of other micromachined structures in the upper substrate portion. For example, singly- or doubly-supported beams can be fabricated at the edges of a given trench, each with their own trenches, with sacrificial, fully-releasable beams fabricated in the given trench. Release of the sacrificial beams produces a large trench gap in the upper substrate portion through which the anchored beams can be actuated. This configuration is particularly advantageous for applications in which relatively large actuation gaps are required; the need for extensive lateral underetching is eliminated.

Once the micromachined structures are fully underetched, the masking layer 30 is then to be removed from the substrate configuration for final processing of the substrate. If conventional photoresist is employed as a masking layer, then a conventional oxygen plasma ash can be carried out for removing the photoresist. To enhance efficiency, it can be preferable to carry out removal of the masking layer in the plasma chamber in which the micromachining etch was carried out. Table IV below provides a photoresist removal recipe that can be employed in a chamber common with the etch recipes given in Tables I–III.

TABLE IV

Example Masking Layer Removal Process Conditions

| | |
|---|---|
| Oxygen gas flow rate | 25 sccm |
| Substrate electrode Power | 12 W |
| Coil electrode Power | 650 W |
| APC | 85° (About 25 mT) |

Figure 1M:
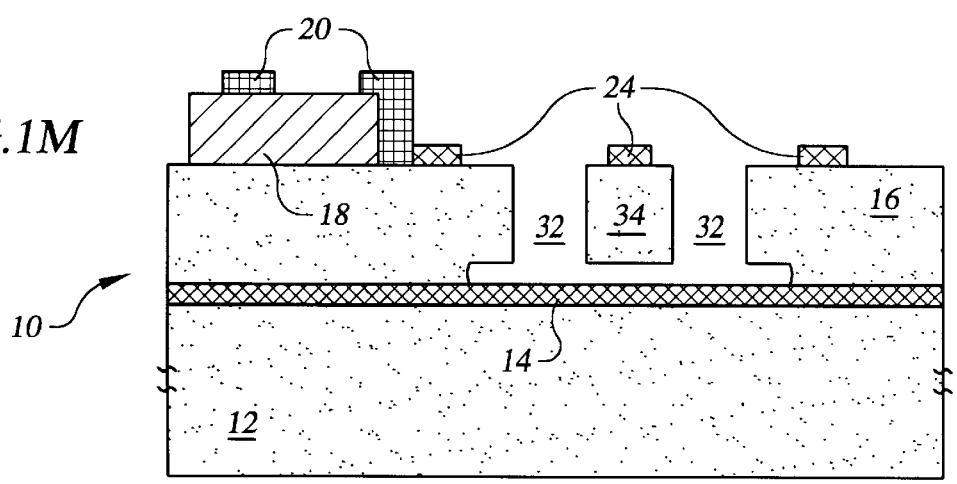

At this point, referring to FIG. 1M, suspended silicon structures 34 are produced and can be electrostatically or mechanically operated for an intended application. It is found, in accordance with the invention, that for many sensor and actuator applications, it is preferable to electrically insulate the walls of the suspended structure and the walls of the trench. This enables electrical insulation such that electrical shorting of the structure does not occur should the structure 34 come into mechanical contact with an outer wall of the trench. In one configuration, provision of the insulating layer 14 under the whole extent of the upper substrate portion 16, along with formation of an electrical insulation film on the suspended structure and trench walls, enables electrical actuation of the structure and electrical sensing of the structure position. In accordance with the invention, an insulating film can be deposited on the micromachined element and the substrate configuration, if desired to provide such sensing or actuation.

A polymer film, e.g., a fluorocarbon film, or an oxide, nitride, or other suitable film can be deposited. For many applications, it can be preferable to not deposit an oxide or nitride film if CMOS or other electronics are resident on the substrate configuration. The temperatures typically required for depositing or growing a nitride or oxide film may be incompatible with the electronics doping profiles and metallization.

In one example process, a fluorocarbon film is deposited in situ in the plasma etch chamber after removal of the masking layer. Table V below provides example ranges of process parameters that can be employed in a chamber common with the recipes given in Tables I–IV, and Table VI below provides a particularly well-suited fluorocarbon deposition recipe that enables formation of a fluorocarbon film of about 0.5 μm in thickness in about 3 minutes.

TABLE V

Example Insulating Film Deposition Process Conditions

| | |
|---|---|
| $C_4F_8$ flow rate | 10–150 sccm |
| Substrate electrode power | 1–29 Watts |
| Coil electrode power | 300–990 Watts |
| APC | 15–75° |

TABLE VI

Preferred Insulating Film Deposition Process Conditions

| | |
|---|---|
| $C_4F_8$ flow rate | 10 sccm |
| Substrate electrode power | 1 Watt |
| Coil electrode power | 990 Watts |
| APC | 45° |

Figure 1N:
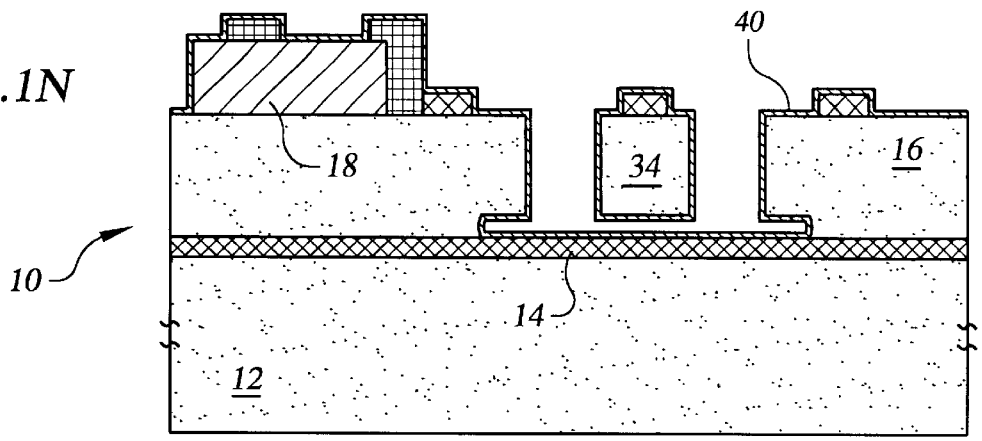

Referring to FIG. 1N, the example polymer deposition recipes given above are isotropic in nature, thereby producing an insulating film 40 that coats the underside of the suspended structure as well as the bottom of the trench and any laterally underetched regions existing under the upper substrate portion 16.

Figure 1O:
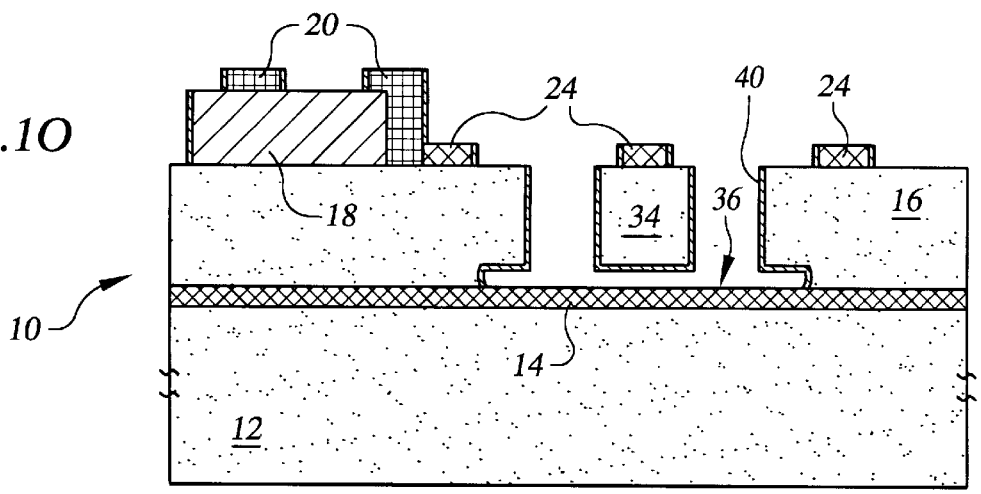

Referring to FIG. 1O, if desired, the insulating film 40 can be removed from horizontal surfaces and from the upper surfaces of the circuitry 18, circuitry metallization 20, and micromachined structure metallization 24. In general, removal of the insulating film 40 from horizontal surfaces is not required, but can be preferred to provide increased vertical actuation space under the suspended element. The lower insulating layer 14 maintains electrical isolation of the suspended element even with the lower film 40 removed. A suitable, preferably dry, removal process is to be employed. If the insulating film is a polymer, then the masking layer removal process conditions given above in Table IV can be employed. Other directional plasma processes, or other suitable process tailored to the specific film composition, can be employed.

If the buried insulating layer 14 was provided as a material, such as photoresist, that enables a temporary reversible bond between the lower substrate portion 12 and the upper substrate portion 16, regions or the entire extent of the upper substrate portion 16 can at this point be released from the lower substrate portion. For most bonding techniques, release can be accomplished by, e.g., forcing a razor edge between the upper substrate portion and the insulating layer. A reversible bond scenario is particularly applicable where the micromachined element is to be assembled in a separate system that may be connected to the lower substrate. Electronics can be provided on one or more regions of the upper substrate portion 16 that are maintained in the configuration.

Figure 3A:
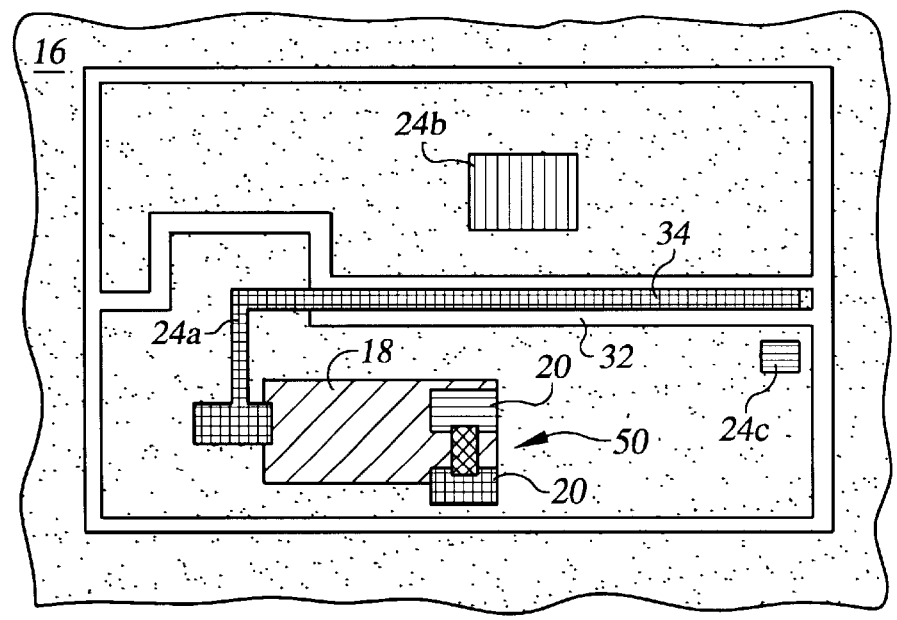
FIGS. 3–9 are example microelectromechanical systems provided by the invention and that can be fabricated by the steps of FIGS. 1A–1O.
Figure 3B:
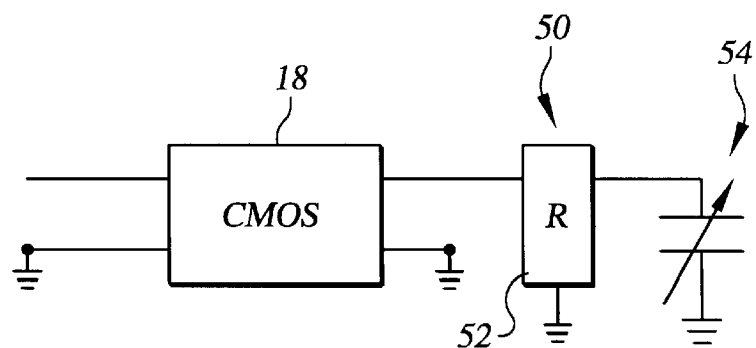

Referring to FIG. 3A there is shown a first example micromachined element that can be produced in accordance with the trench etch and lateral underetch of the invention. In this example the micromachined element 34 is a cantilever beam that provides a variable capacitance as it is deflected laterally across a trench 32. Electrical connection to the beam 34 is made by metallization 24a connecting it to CMOS electronics 18. The beam 34 is actuated electrostatically by applying a voltage between the beam metallization 24a and actuation metallization 24b. The beam displacement causes a capacitance change between the beam metallization 24a and a metallization point 24c. A quiescent capacitance is that produced when the beam is in a non-actuated position, as in the figure. Referring also to FIG. 3B, a resistor configuration 50 is provided in parallel with a capacitor 54 formed by the cantilever beam. The RC time constant of the CMOS circuit can be modified by electrically actuating the beam 34.

Figure 4A:
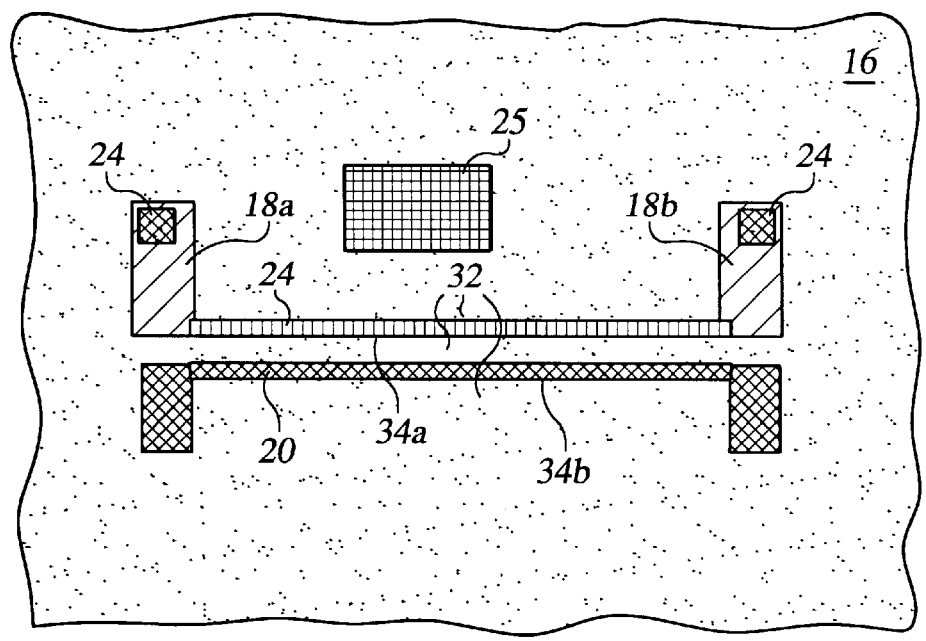
Figure 4B:
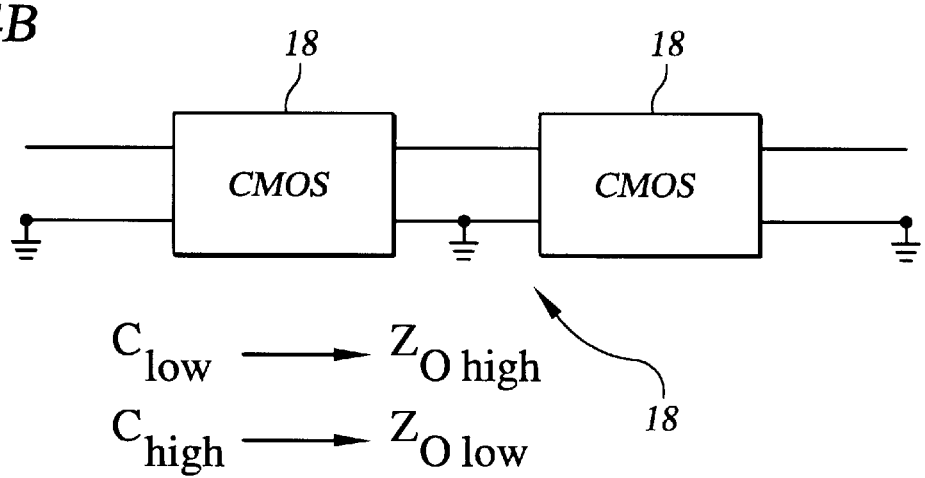

FIG. 4A schematically depicts a further example micromachined element produced in accordance with the trench etch and lateral underetch of the invention. Here two micromachined elements 34a, 34b are provided, each as a doubly supported beam that can be moved laterally across a trench gap toward and away from each other. Metallization 24, 20, is provided on the elements 34a, 34b, respectively. As shown in FIG. 4B, this configuration enables control of the impedance of the transmission line characteristics between two circuits 18a, 18b. The transmission line has a characteristic impedance that is a function of the separation between the beams 34a, 34b. Upon electrostatic actuation of the beams, with the metallization point 25, the impedance of the line can be changed. This change can serve as an electronic switch. Because actuation of the two parallel beams is unstable, there are only two stable positions for the configuration; open and closed, or relaxed and actuated. This enables a convenient switching scenario.

Figure 5A:
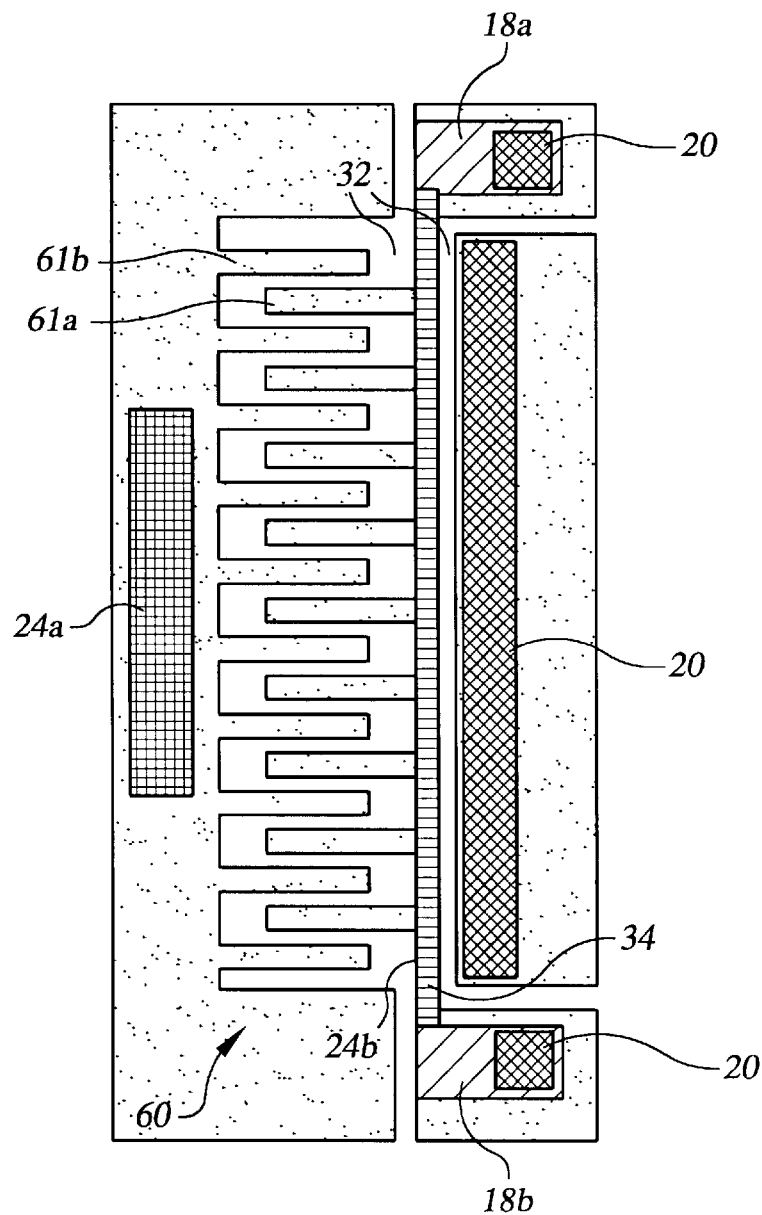
Figure 5B:
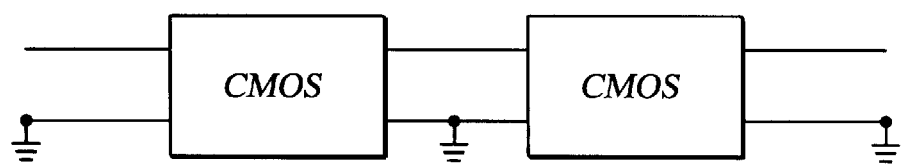

Referring to FIG. 5A there is schematically depicted an example micromachined element in accordance with the invention where the element 34 is a doubly-supported beam connected to a first set 61a of fingers in a pair of interdigitated finger sets 60. The beam 34 and first set 61a of fingers is free to move laterally in response to an actuation field generated by voltages applied between a first metallization point 24a and metallization 24b on the beam 34. A second set 61b of interdigitated fingers is spatially fixed. With the metallization 20 provided, this enables, as shown in FIG. 5b, modification and control of the characteristic impedance between two circuits 18a, 18b. Electrostatic actuation of the beam 34 to the left in the figure results in a capacitance decrease and a corresponding transmission line impedance increase. The capacitance variation is here continuous, enabling a tuning of impedance to maximize signal transfer between the two circuits.

Figure 6:
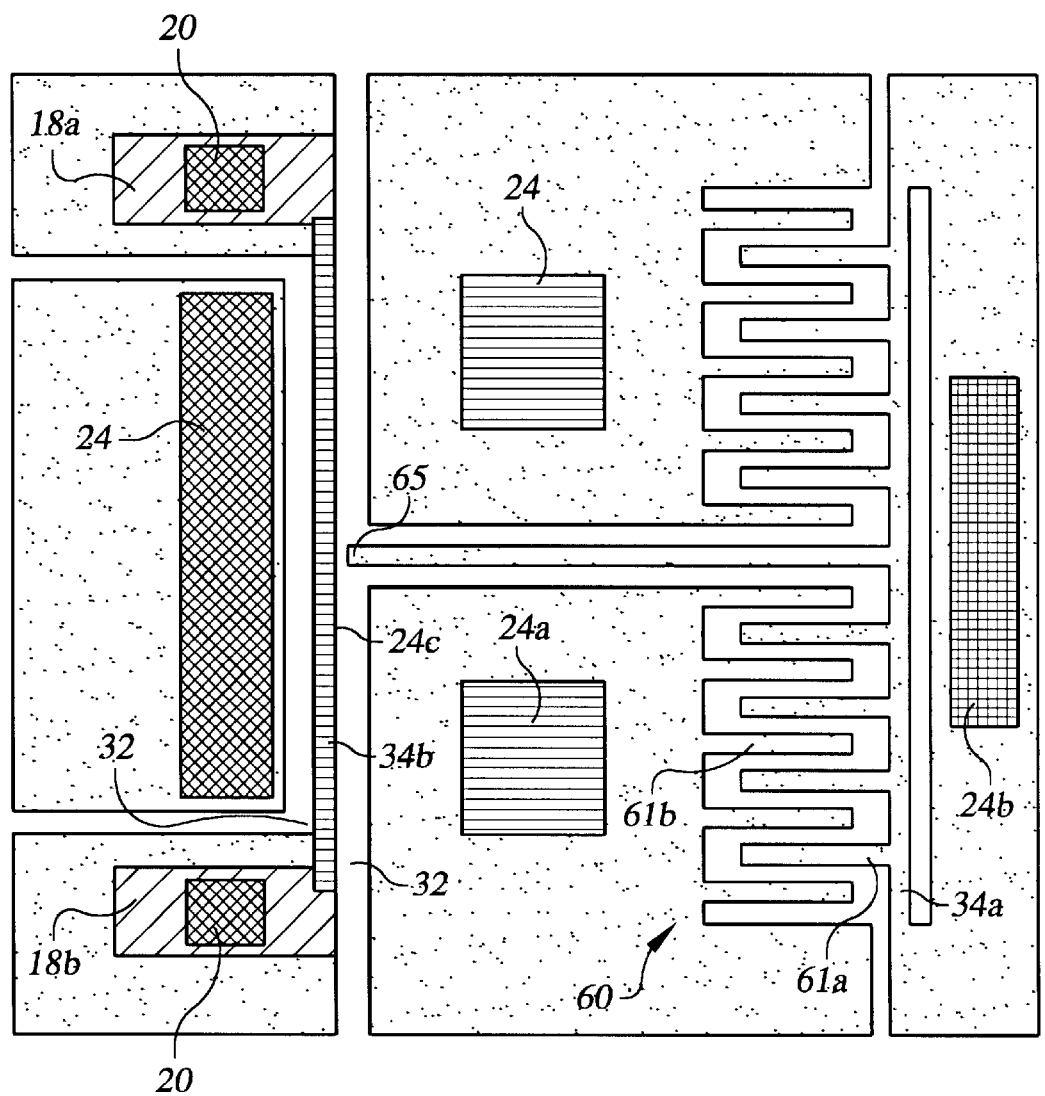

FIG. 6 depicts a further example of a micromachined element provided by the invention. Here the circuitry 18a, 18b and the transmission line 24 are electrically isolated from the actuation mechanism. A first doubly-supported beam 34a is connected to a first, moveable set 61a of fingers in a pair of fingers 60. One of the fingers 65 extends to a point for contact with a second doubly-supported beam 34b. The second set 61b of fingers in the interdigitated pair is not free to move. Application of a voltage between two isolated metallization points 24a, 24b results in the actuation of the first beam 34 to the left. This causes the extended finger 65 to contact and push against the second beam 34b, resulting in an increase in capacitance. The characteristic impedance can therefore be decreased in a continuous manner by electrostatic actuation for fine tuning.

Figure 7:
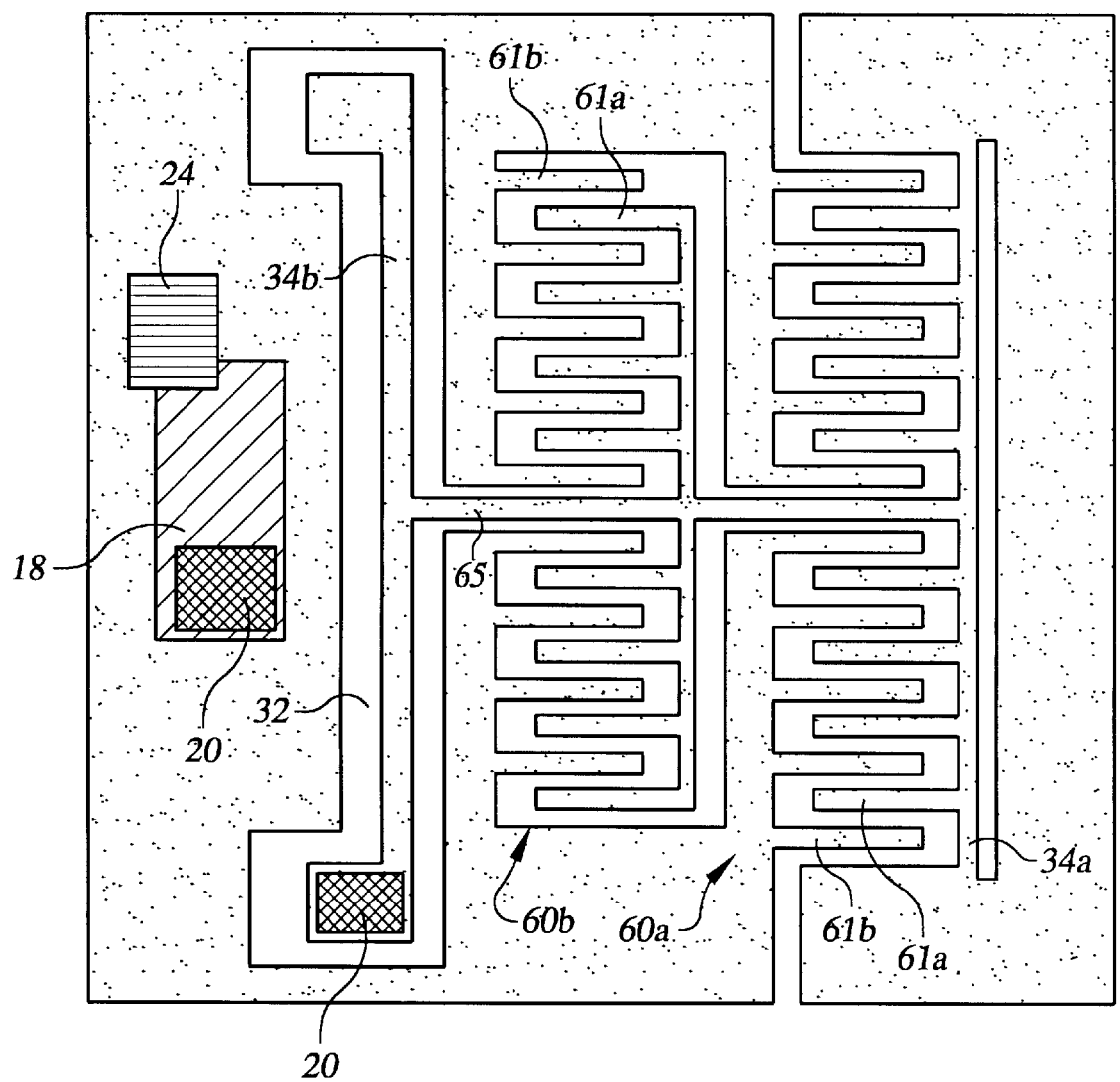

There is shown in FIG. 7 a variation of this configuration. Here two interdigitated finger pairs 60a, 60b are provided, each with a moveable set of fingers 61a and fixed set of fingers 61b. A first doubly-supported beam 34a is connected to a first set of moveable fingers. An extended finger 65 is connected to the first beam 34a and between the two pairs of fingers, being attached at a second doubly-supported beam 34b. Like the configuration of FIG. 6, this arrangement enables tuning of transmission line impedance by increasing capacitance and decreasing impedance.

Figure 8:
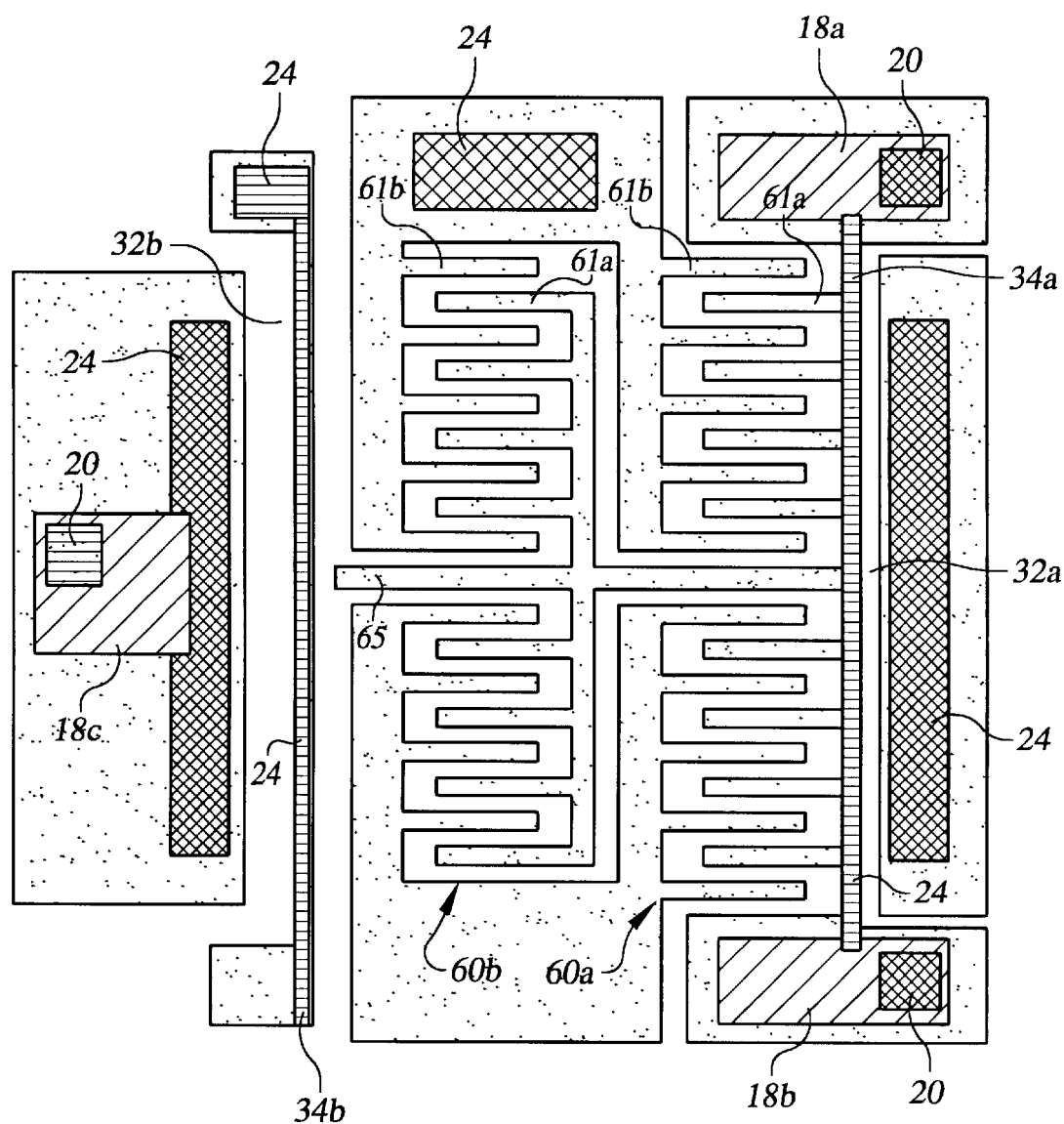

Referring to FIG. 8, there is schematically depicted a configuration based on the configurations of FIGS. 6–7, here with two transmission lines, one on the right of the figure, associated with circuitry 18a, 18b; and one on the left of the figure, associated with circuitry 18c. Actuation of the first doubly-supported beam 34a to the left increases the impedance of the first transmission line and decreases the impedance of the second transmission line. This functionality is enabled by an extended finger 65 between the two pairs 60a, 60b of interdigitated finger pairs. A first set 61a in each pair is moveable, while a second set 61b in each pair is fixed. This configuration enables switching of transmission lines, by providing the capability to tune in one line while tuning out the other line. The extent of the gaps 32a, 32b across which the beams 34a, 34b, respectively, are actuated are preferably selected such that that are not equal, whereby one line can be tuned in while the other is tuned out.

Figure 9:
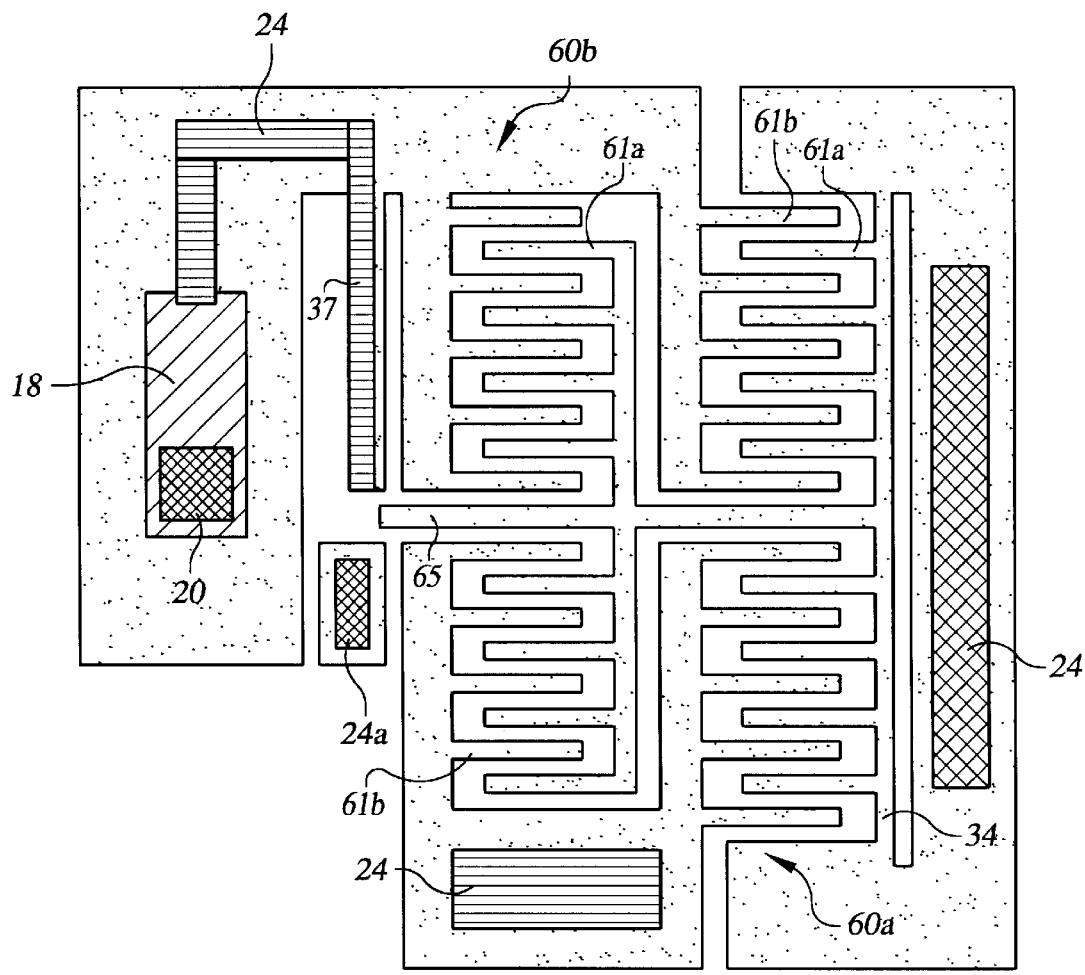

FIG. 9 depicts a configuration provided by the invention where a continuous capacitance change can be controlled. Here a doubly-supported beam 34 is connected to a first, moveable set 61a of fingers in a first pair 60a of interdigitated fingers. An extended finger 65 is connected between the beam and the first finger pair 60a through a second moveable set 61a of fingers in a second finger pair 60b. Electrostatic actuation of the beam 34 to the left in the figure results in movement of the extended finger 65 between two fixed metallization points 24a, 37. This results in the ability to continuously adjust the capacitance between the two points.

Figure 10A:
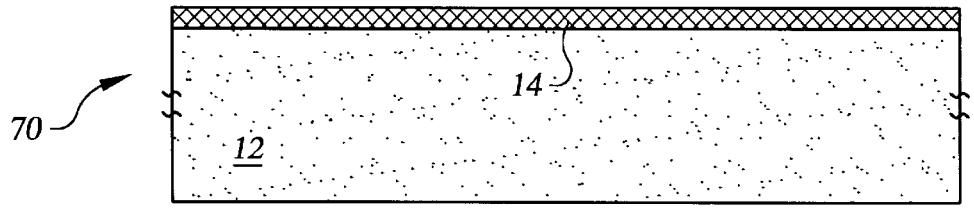
FIGS. 10A–10F are schematic cross-sectional views of a substrate configuration undergoing a set of fabrication steps of the plasma etch process of the invention for producing an angled trench.

Referring now to FIG. 10A, the invention provides additional processes for micromachining features in a substrate. This class of processes enables the formation of angled trenches in a substrate, with the ability to produces multiple trenches, of differing angle, on the same substrate. In a first step of the process, an insulating layer 14 is formed on a lower substrate portion 12. The angled trenches will ultimately be produced in this lower substrate portion. The lower substrate portion preferably is formed of silicon, e.g., a single crystal silicon substrate, or other suitable configuration.

The insulating layer 14 can be formed of the materials described earlier and can be formed by any of the processes described earlier. For example, the insulating layer 14 here can be formed as a thermally-grown silicon dioxide layer, e.g., of about 1 $\mu$m in thickness, as a spin-applied layer of photoresist, e.g., of about 5 $\mu$m in thickness, or other suitable material.

Figure 10B:
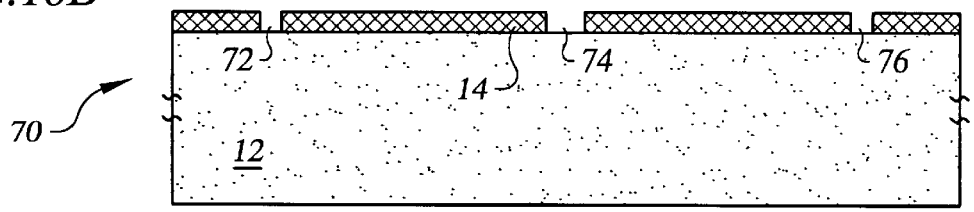

Referring to FIG. 10B, the insulating layer 14 is photolithographically patterned to include one or more openings 72, 74, 76 in the layer 14. The location, geometry, and lateral extent of each of the openings in the insulating layer are to be selected based on the desired angle and size of corresponding trenches to be etched in the lower substrate portion 12. Each of these considerations will be explained in detail below. The insulating layer can be photolithographically patterned by conventional techniques. Wet chemical etching, e.g., hydrofluoric acid etching, or dry plasma etching, can be employed for producing the insulating layer openings.

Figure 10C:
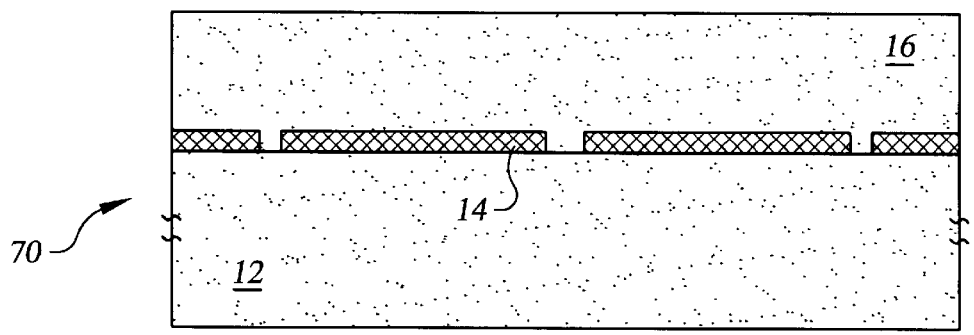

Referring to FIG. 10C, an upper substrate portion 16 is then formed on the patterned insulating layer 14. The upper substrate portion can be produced by, e.g., bonding a wafer to the insulating layer in the manner described earlier. The processes described above for producing the upper substrate portion 16 generally can be employed here with the exception of polysilicon deposition; as shown in FIG. 10C, the openings 72, 74, 76 in the insulating layer 14 preferably are preserved after the upper substrate portion 16 is produced and such would not be enabled by a film deposition technique. The upper substrate portion can be reversibly or permanently bonded to the insulating layer, based on the selected application for the angled trenches to be formed.

Figure 10D:
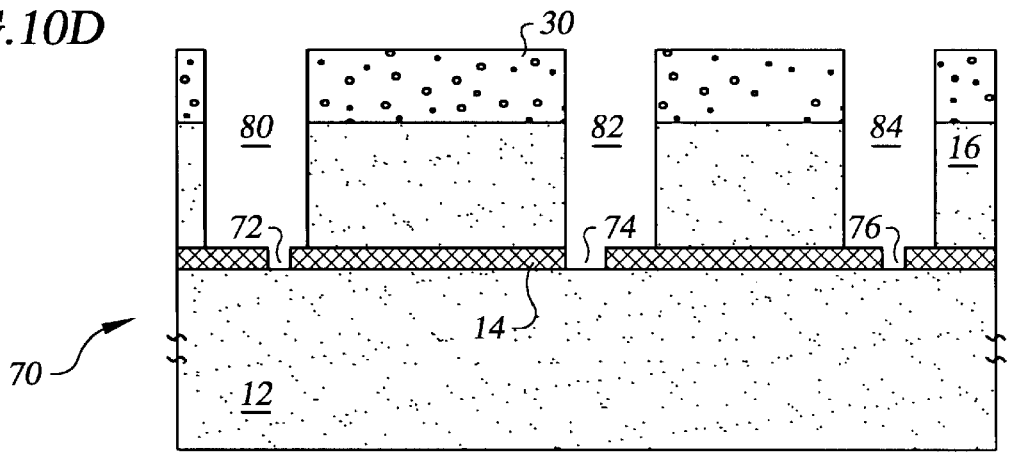

Referring to FIG. 10D, The upper substrate portion 16 is then masked with a photolithographically-patterned layer 30 and etched to form trenches 80, 82, 84 in the upper substrate portion that expose regions of the underlying insulating layer and the corresponding openings 72, 74, 76 in the layer. Specifically, each opening in the insulating layer is positioned with respect to a corresponding trench so that it is located at a selected position along the floor of the corresponding trench.

The masking, photolithography, and trench formation can be carried out in the manner previously described, specifically with reference to FIGS. 1F, 1G, and 1K. The wide range of plasma etch recipes described earlier can be employed here for producing the trenches in the upper substrate portion. The upper substrate portion 16 can be patterned and etched prior to its bonding to the insulating layer. Such a scenario enables the repeated use of a patterned upper substrate portion because in general, no electronics are to be fabricated on the substrate portion in this process. If electronics are to be fabricated in the upper substrate portion, then the portion should be bonded prior to the trench formation.

In the case of an upper substrate portion produced for repeated etch use, it is preferred in accordance with the invention that the upper portion be formed of a silicon wafer that is double-sided polished. After patterning and etching, the wafer can be thermally oxidized and then reversibly bonded to the insulating layer. As with the process described earlier, such a reversible bond can be produced by cleaning the two substrate components, contacting the components together under pressure, and heating the contacted components, e.g., at a temperature of about 90° C. for about 10 minutes. This maintains contact between the components during the proceeding fabrication, but enables removal of the upper substrate portion at the conclusion of the process by, e.g., forcing a razor edge between the substrate components.

Figure 10E:
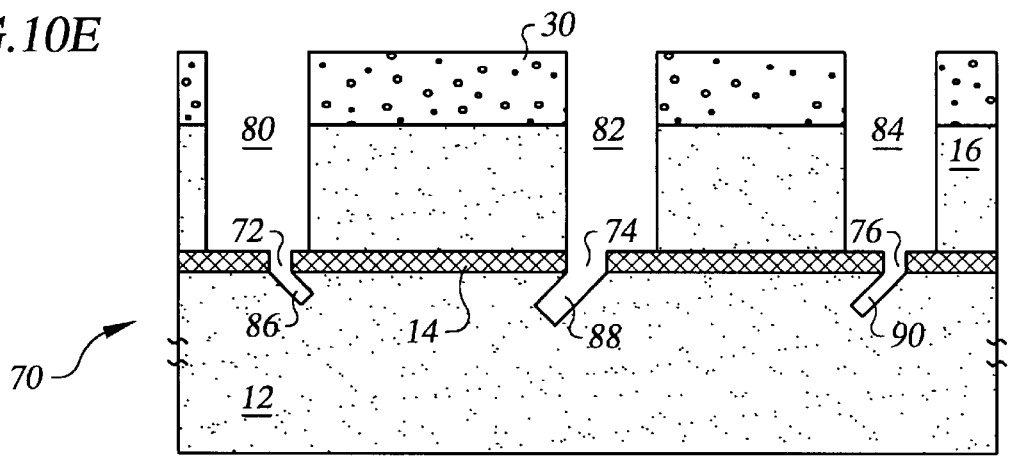

Referring to FIG. 10E, the etch employed to produce the upper substrate portion trenches 80, 82, 84, or other suitable silicon etch, is then carried out to etch angled trenches 86, 88, 90 in the lower substrate portion 12 through the openings in the insulating layer. In other words, the regions of the lower substrate portion 12 that are exposed by the openings in the insulating layer are etched, and are etched at an angle.

The angle of each trench etched in the lower substrate portion is determined by the location of the corresponding insulating layer opening along the bottom of the corresponding trench in the upper substrate portion. This angled trench etch is enabled by the same ion deflection mechanism exploited in accordance with the invention for laterally underetching the upper substrate portion, as described earlier. The lateral underetch of the upper substrate portion also occurs in this angled trench etch process, but the lateral underetch profile is omitted in FIG. 10E for clarity.

Given that the requirements described earlier for enabling plasma ion flux redirection are provided here, namely, a trench in the upper substrate portion 16 that is of sufficient aspect ratio, a robust insulating layer, and a plasma etch recipe that etches silicon and that provides directional ions that can remove any passivating species that may build up at the lower walls of the trench, then the trenches etched through the insulating layer openings into the lower substrate portion proceed at some angle based on the proximity of the insulator layer opening to the edge of the trench in the upper substrate portion.

A trench of substantially no angle, i.e., straight downward into the lower substrate portion, is produced when an insulating layer opening is centered with respect to the corresponding trench in the upper substrate portion. A maximum trench angle in the lower substrate portion is produced when an insulating layer opening is aligned with the wall of the corresponding trench in the upper substrate portion. A continuous variation from minimum to maximum trench angle can be produced by adjusting the location of an insulating layer opening with respect to the walls of the corresponding trench in the upper substrate portion.

When the substrate configuration is exposed to a directional plasma etch like those described earlier, electrically positive charging of the insulating layer and electrically negative charging of the upper regions of a trench in the upper substrate portion result in local electric fields that redirect the flux of ions in the plasma such that, depending on the proximity of the insulating layer opening to a trench sidewall, the plasma ions may not be directed perpendicularly downward through the opening in the insulating layer. The ion flux redirection is most prominent at the trench edges, resulting in a sharply angled trench in the lower substrate portion for such a configuration. For an insulating layer opening centered with respect to a corresponding upper trench, the plasma ions are directed substantially perpendicularly downward, resulting in a vertical trench in the lower substrate portion.

As explained earlier, a relatively larger aspect ratio in the upper substrate portion trench results in a larger ion flux deflection. Thus, for a given insulating layer opening location and size, a larger upper trench aspect ratio can be expected to produce larger angles in etching a lower trench. Although the insulating layer opening can take any geometry, the lateral extent of the opening impacts the angled trench etch. A larger opening results in the capture of a wider angular distribution of ion flux. Because the angle of an etched trench in the lower substrate portion is characterized by the average angular distribution of ions directed through the insulating layer opening, an increase in the lateral extent of an opening results in a decrease in the range of trench angles that can be produced.

The fraction of plasma ion flux captured through the insulating layer opening is proportional to the ratio of the lateral size of the opening to the lateral size of the upper trench. Thus, the etching rate of the angled trench is equivalent to that for a trench having the insulating layer opening width and a depth that is the thickness of the upper substrate portion. It is to be recognized in accordance with the invention that given the many process geometry and process recipe factors that influence the angle of the trench etch, some empirical investigation is preferably to be carried out to determine the precise conditions for achieving a desired trench angle.

Figure 10F:
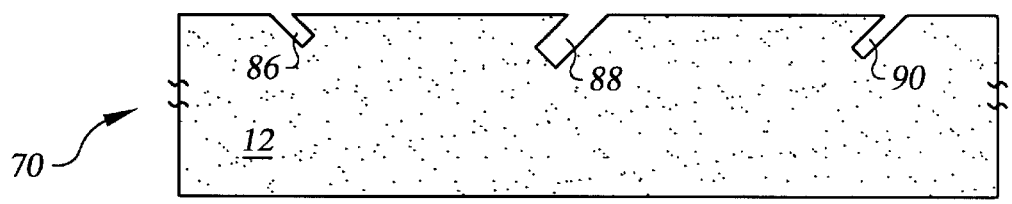

Referring to FIG. 10F, once the trench or trenches of selected depth are formed in the lower substrate portion, the masking layer 30, upper substrate portion 16, and insulating layer 14 can be removed, employing the processes described earlier or as conventional, to produce a substrate 12 in which are provided angled trenches. Removal of the upper layers is not required and not desired if such are to be employed or are not cumbersome for a given application. Once the layers of no further interest are removed, additional processing can be carried out on the lower substrate portion.

The angled trench etch of the invention overcomes the many shortcomings of conventional approaches for etching angled trenches. Chemical Assisted Ion Beam Etching (CAIBE) is commonly employed for angle trench etches, but requires dedicated fabrication equipment that during one process run can produce only one selected angle. The angled trench etch of the invention enables the production of multiple trenches, each at a different angle if desired, on the same substrate, by one and the same process step.

Figure 11A:
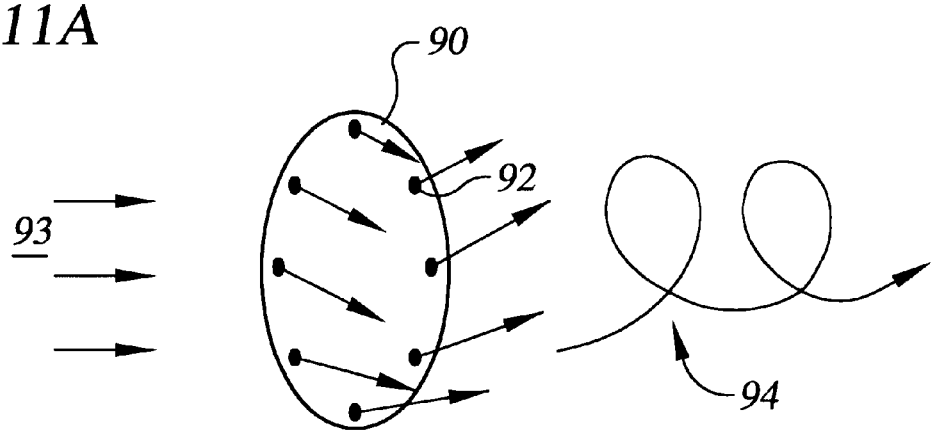
FIGS. 11A–11B are example fluidic channel systems provided by the invention and that can be fabricated by the steps of FIGS. 10A–10F.

This capability enables a wide range of micromechanical structures that can be efficiently fabricated. For example, referring to FIG. 11A, there is schematically shown a substrate 90 in which has been etched angled trenches 92. The trenches extend through the entire thickness of the substrate and thus are here produced as fluid channels. Each fluid channel is of a selected angle. Fluid 93 directed through the channels is influenced based on the angles of the channels. For example, as shown in the figure, swirl 94 can be imparted to the fluid with a corresponding pattern of channel angles in the substrate.

Such angled fluid channels can be produced in accordance with the invention by employing a thin lower substrate portion 12 through which the angled trench etch can fully proceed, or by other suitable process. For example, the lower substrate portion 12, referring to, e.g., FIG. 10A, can be formed of a selected thickness for the fluid channels and reversibly bonded at its bottom surface to a handle substrate. The reversible bond can be achieved by, e.g., a layer of photoresist, or by non-permanent bonding of, e.g., the lower substrate portion to an oxide layer provided on the handle substrate. A wet etch or other suitable technique can here be employed to release the etched lower substrate portion from the handle wafer. A SOI, SIMOX, or other substrate configuration can be particularly efficient for this process, in the manner previously described.

Figure 11B:
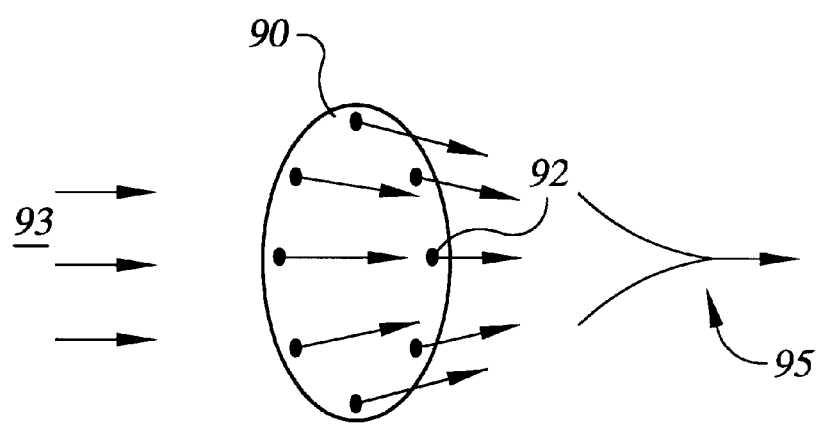

Referring to FIG. 11B, there is shown a further example for a substrate 90 including an array of fluid channels 92. In this configuration, the fluid channel array processes input fluid 93 to impose a convergence 95. This can be particularly advantageous for applications requiring efficient fluid mixing. Beyond the two examples of FIGS. 11A–11B, the invention contemplates employing the angled trench etch technique for producing a wide range of microelectromechanical structure features that historically have been limited by fabrication constraints. The angled trench technique expands the ability to precisely and, to a large extent, arbitrarily, tailor the shape of microfabricated structures and to do so very efficiently.

The plasma etch techniques of the invention further expand fabrication capabilities by providing a highly efficient trench and lateral underetch technique. This technique enables a completely dry process for producing suspended silicon structures, and thereby eliminates the stiction and other challenges associated with conventional wet etch techniques. The technique is fully compatible with microelectronic processes, and therefore enables micromachining in a conventional fabrication line. Perhaps even more importantly, CMOS, bipolar, or other electronics can be fabricated locally on the substrate which is to produce micromechanical structures. This enables the true integration of sensor and actuator structures and process electronics, for producing a complete system on a single chip.

This discussion highlights the important advantages of the plasma etch processes of the invention for expanding the capability of fabricating microelectromechanical systems. The invention provides a large number of process parameters that can be selected to operate in concert to fine tune a selected etch profile or rate. This flexibility enables the fabrication of structural features in a wide range of configurations. It is recognized, of course, that those skilled in the art may make various modifications and additions to the plasma etch processes described above without departing from the spirit and scope of the present contribution to the art. Accordingly, it is to be understood that the protection sought to be afforded hereby should be deemed to extend to the subject matter of the claims and all equivalents thereof fairly within the scope of the invention.

I claim:

1. A method for producing a silicon structure comprising the steps of:

providing a substrate configuration including a silicon layer having a first face and a thickness corresponding to a specified thickness of the silicon structure, and further including a layer of an electrically-insulating material located below and adjacent to the silicon layer;

etching a substantially vertical trench from the first face in the silicon layer to a depth that exposes the insulating layer; and exposing the trench in the silicon layer to a gaseous environment that is reactive with silicon, to substantially lateral etch the silicon layer preferentially at the depth of the insulating layer along a surface of the insulating layer, the lateral etch being continued for a duration that results in release of a silicon element over the insulating layer.

2. The method of claim 1 wherein the electrically-insulating material comprises silicon dioxide.

3. The method of claim 1 wherein the electrically-insulating material comprises silicon nitride.

4. The method of claim 1 wherein the electrically-insulating material comprises a polymer.

5. The method of claim 1 wherein the step of providing a substrate configuration comprises:

forming the electrically-insulating layer on a first silicon substrate;

bonding a second silicon substrate to the formed insulating layer;

thinning the second silicon substrate to the specified silicon structure thickness.

6. The method of claim 5 wherein the step of forming the electrically-insulating layer comprises growing a layer of silicon dioxide.

7. The method of claim 5 wherein the step of forming the electrically-insulating layer comprises spin-coating a layer of polymer.

8. The method of claim 1 wherein the step of providing a substrate configuration comprises:

forming the electrically-insulating layer on a silicon substrate; and forming on the insulating layer a polysilicon layer of the specified silicon structure thickness.

9. The method of claim 1 wherein the reactive gaseous environment comprises a plasma environment characterized as being an anisotropic silicon etchant.

10. The method of claim 9 wherein the reactive gaseous environment is provided as alternating time intervals of a first environment comprising $SF_6$ and a second environment comprising $C_4F_8$.

11. The method of claim 1 further comprising a step of photolithographically defining lateral edges of the silicon element, to be formed by the vertical trench etch in the silicon layer.

12. The method of claim 11 wherein the photolithographic definition of silicon structure lateral edges comprises photolithographic definition of a lateral anchor from the silicon structure to the silicon layer; and wherein the step of reactive gaseous environment exposure of the silicon layer is carried out until the silicon structure is vertically suspended over the insulating layer but laterally anchored to the silicon layer.

13. The method of claim 11 wherein the photolithographic definition of silicon structure lateral edges comprises photolithographic definition of a trench that completely circumscribes the silicon element; and wherein the step of reactive gaseous environment exposure of the silicon layer is carried out until the silicon element is completely released from the silicon layer.

14. The method of claim 1 further comprising the steps of:
fabricating electronics on the silicon layer;
coating the electronics with a removable protective coating, prior to the trench exposure to the reactive gaseous environment; and
removing the protective coating after production of the silicon structure.

15. The method of claim 1 further comprising a last step of coating the silicon structure with an electrically-insulating film.

16. The method of claim 1 further comprising the steps of:
etching a via from a back side of the substrate configuration through the insulating layer to expose the silicon layer; and
forming an electrically conducting layer in the via.

17. The method of claim 14 further comprising a last step of forming an electrical interconnection between the silicon structure and the electronics.

18. The method of claim 12 wherein the step of reactive gaseous environment exposure of the silicon layer is carried out until a doubly-supported silicon beam is suspended over the insulating layer.

19. The method of claim 12 wherein the step of reactive gaseous environment exposure of the silicon layer is carried out until a silicon cantilever beam is suspended over the insulating layer.

20. The method of claim 12 wherein the step of reactive gaseous environment exposure of the silicon layer is carried out until a pair of interdigitated finger elements are suspended over the insulating layer.

21. A method for etching an angled trench in a silicon layer comprising the steps of:
providing a substrate configuration including a first silicon layer having at least one trench etched through the first silicon layer a layer of an electrically-insulating material located below and adjacent to the silicon layer, the insulating layer including an aperture that is located at a non-central location with respect to the trench and corresponding to a prespecified trench angle, and further including a second silicon layer, in which the angled trench is to be formed, below and adjacent to the insulating layer; and
exposing the trench in the first silicon layer to a gaseous environment that is reactive with silicon to etch that region of the second silicon layer that is exposed by the aperture in the insulating layer to a selected angled trench depth and prespecified trench angle.

22. The method of claim 21 further comprising the step of removing the first silicon layer and the insulating layer after etching the angled trench in the second silicon layer.

23. The method of claim 21 wherein the electrically-insulating material comprises silicon dioxide.

24. The method of claim 21 wherein the electrically-insulating material comprises silicon nitride.

25. The method of claim 21 wherein the electrically-insulating material comprises a polymer.

26. The method of claim 21 wherein the step of providing a substrate configuration comprises:
forming the electrically-insulating layer on a first silicon substrate;
patterning the insulating layer to form an aperture in the insulating layer;
bonding a second silicon substrate to the formed insulating layer; and
etching at least one trench in the second silicon substrate.

27. The method of claim 26 wherein the step of forming the electrically-insulating layer comprises growing a layer of silicon dioxide.

28. The method of claim 26 wherein the step of forming the electrically-insulating layer comprises spin-coating a layer of polymer.

29. The method of claim 21 wherein the reactive gaseous environment comprises a plasma environment characterized as being an anisotropic silicon etchant.

30. The method of claim 29 wherein the reactive gaseous environment is provided as alternating time intervals of a first environment comprising $SF_6$ and a second environment comprising $C_4F_8$.

* * * * *